(12) United States Patent
Wakana

(10) Patent No.: US 11,036,150 B2
(45) Date of Patent: Jun. 15, 2021

(54) EXTREME ULTRAVIOLET LIGHT GENERATION APPARATUS AND MAINTENANCE METHOD

(71) Applicant: Gigaphoton Inc., Tochigi (JP)

(72) Inventor: Katsuhiko Wakana, Oyama (JP)

(73) Assignee: Gigaphoton Inc., Tochigi (JP)

(*) Notice: Subject to any disclaimer, the term of this patent is extended or adjusted under 35 U.S.C. 154(b) by 0 days.

(21) Appl. No.: 16/731,561

(22) Filed: Dec. 31, 2019

(65) Prior Publication Data
US 2020/0142311 A1 May 7, 2020

Related U.S. Application Data

(63) Continuation of application No. PCT/JP2017/029295, filed on Aug. 14, 2017.

(51) Int. Cl.
*G03F 7/20* (2006.01)
*H05G 2/00* (2006.01)

(52) U.S. Cl.
CPC ...... *G03F 7/70975* (2013.01); *G03F 7/70033* (2013.01); *G03F 7/70166* (2013.01); *G03F 7/70991* (2013.01); *H05G 2/008* (2013.01)

(58) Field of Classification Search
CPC .... G03F 7/20; G03F 7/70033; G03F 7/70166; G03F 7/70975; G03F 7/70991; G03F 7/70175; G03F 7/70008; G03F 7/70141; G03F 7/70508; G03F 7/70525; G03F 7/70533; G03F 7/7055; G03F 7/70558; G03F 7/70591; G03F 7/70808; G03F 7/70833; G03F 7/7085; G03F 7/70858;
(Continued)

(56) References Cited

U.S. PATENT DOCUMENTS

2006/0176460 A1* 8/2006 Phillips ............... G03F 7/70975
355/67
2008/0104828 A1* 5/2008 Someya ............. G03F 7/70975
29/720
(Continued)

FOREIGN PATENT DOCUMENTS

JP 2004-193468 A 7/2004
JP 2008-034480 A 2/2008
(Continued)

OTHER PUBLICATIONS

International Search Report issued in PCT/JP2017/029295; dated Oct. 24, 2017.
(Continued)

*Primary Examiner* — Christina A Riddle
(74) *Attorney, Agent, or Firm* — Studebaker & Brackett PC

(57) ABSTRACT

An extreme ultraviolet light generation apparatus includes: an optical base; and a chamber module replaceable from the optical base. The chamber module includes a chamber in which extreme ultraviolet light is generated, a condenser mirror disposed inside the chamber and configured to condense extreme ultraviolet light generated inside the chamber, a window configured to transmit, into the chamber, a laser beam introduced into the optical base, and having a function to seal up the chamber, and a laser beam condensation optical system configured to condense the laser beam having transmitted through the window.

7 Claims, 19 Drawing Sheets

(58) Field of Classification Search
CPC ............. G03F 7/70883; G03F 7/70908; G03F 7/70925; H05G 2/00–008; G02B 7/023; B08B 7/0035; B60V 3/04; B65G 1/0435
USPC ..... 355/30, 67–77; 250/492.1–504 R, 505.1, 250/522.1, 372, 548
See application file for complete search history.

(56) References Cited

U.S. PATENT DOCUMENTS

| | | | |
|---|---|---|---|
| 2010/0051832 A1 | 3/2010 | Nishisaka et al. | |
| 2010/0078577 A1* | 4/2010 | Moriya | H01S 3/10 250/504 R |
| 2010/0193711 A1 | 8/2010 | Watanabe et al. | |
| 2010/0288937 A1* | 11/2010 | Watanabe | G03F 7/70033 250/372 |
| 2013/0105713 A1 | 5/2013 | Watanabe et al. | |
| 2014/0332700 A1 | 11/2014 | Igarashi et al. | |

FOREIGN PATENT DOCUMENTS

| | | |
|---|---|---|
| JP | 2010080941 A | 4/2010 |
| JP | 2011-029587 A | 2/2011 |
| JP | 2013-069655 A | 4/2013 |
| JP | 5554032 B2 | 7/2014 |
| JP | 2017-097375 A | 6/2017 |

OTHER PUBLICATIONS

International Preliminary Report on Patentability and Written Opinion issued in PCT/JP2017/029295; dated Feb. 18, 2020.

An Office Action; "Notification of Reasons for Refusal," mailed by the Japanese Patent Office dated Feb. 2, 2021, which corresponds to Japanese Patent Application No. 2019-536367 and is related to U.S. Appl. No. 16/731,561; with English language translation.

* cited by examiner

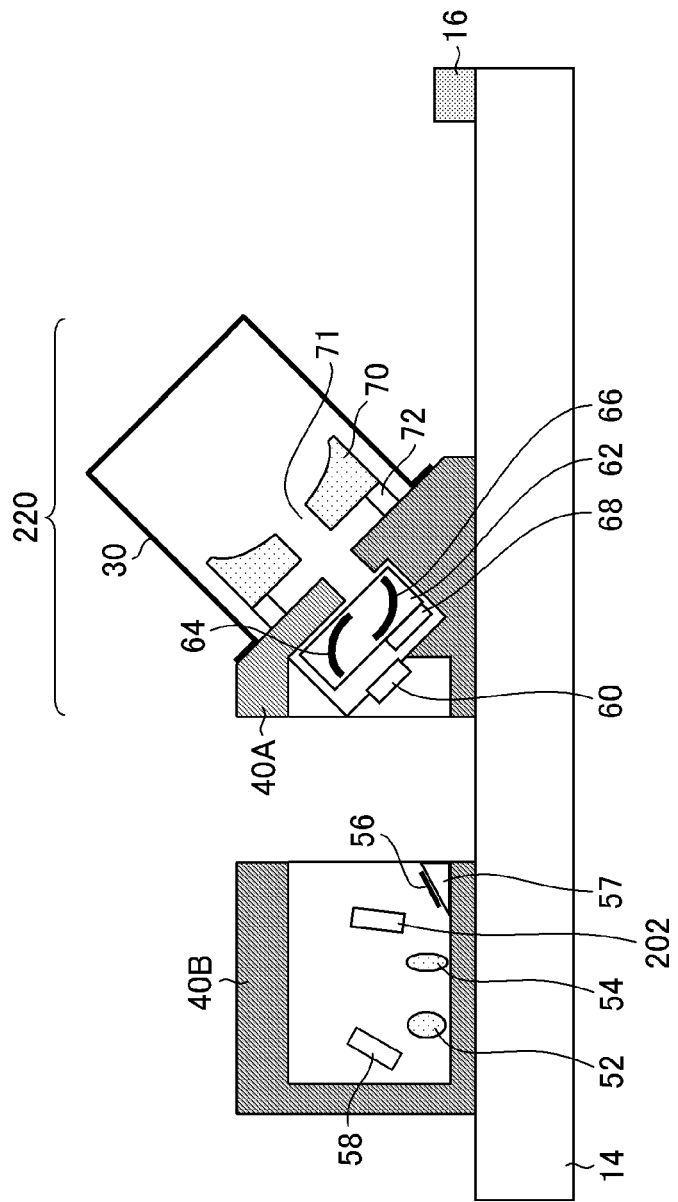

EXTREME ULTRAVIOLET LIGHT GENERATION APPARATUS AND MAINTENANCE METHOD

CROSS-REFERENCE TO RELATED APPLICATIONS

The present application is a continuation application of International Application No. PCT/JP2017/029295 filed on Aug. 14, 2017. The content of the application is incorporated herein by reference in its entirety.

BACKGROUND

1. Technical Field

The present disclosure relates to an extreme ultraviolet light generation apparatus and a maintenance method.

2. Related Art

Recently, miniaturization of a transfer pattern in optical lithography of a semiconductor process has been rapidly proceeding along with miniaturization of the semiconductor process. Minute fabrication at 20 nm or smaller will be requested in the next generation technology. To meet the request for minute fabrication at 20 nm or smaller, for example, it is desired to develop an exposure device including an extreme ultraviolet light generation device configured to generate extreme ultraviolet (EUV) light at a wavelength of 13 nm approximately in combination with reduced projection reflective optics.

Disclosed EUV light generation apparatuses include three kinds of devices: a laser produced plasma (LPP) device that uses plasma generated by irradiating a target material with a laser beam, a discharge produced plasma (DPP) device that uses plasma generated by electrical discharge, and a synchrotron radiation (SR) device that uses synchrotron radiation.

LIST OF DOCUMENTS

Patent Documents

Patent Document 1: Japanese Patent No. 5554032
Patent Document 2: Japanese Unexamined Patent Application Publication No. 2004-193468

SUMMARY

An extreme ultraviolet light generation apparatus according to an aspect of the present disclosure includes: an optical base; and a chamber module replaceable from the optical base. The chamber module includes a chamber in which extreme ultraviolet light is generated, a condenser mirror disposed inside the chamber and configured to condense extreme ultraviolet light generated inside the chamber, a window configured to transmit, into the chamber, a laser beam introduced into the optical base, and having a function to seal up the chamber, and a laser beam condensation optical system configured to condense the laser beam having transmitted through the window.

An extreme ultraviolet light generation apparatus according to another aspect of the present disclosure includes: an optical base; a chamber module replaceable from the optical base; and a movement mechanism configured to move the optical base and the chamber module. The movement mechanism includes a first mechanism configured to move the optical base and the chamber module in a first direction, and a second mechanism configured to move the chamber module in a second direction not parallel to the first direction.

A maintenance method according to another aspect of the present disclosure is a maintenance method for an extreme ultraviolet light generation apparatus connected with an exposure apparatus. The maintenance method includes: separating, from the exposure apparatus, an optical base of the extreme ultraviolet light generation apparatus and a chamber module replaceable from the optical base, and moving the optical base and the chamber module in a first direction; moving, in a second direction not parallel to the first direction, the chamber module moved in the first direction; and replacing the chamber module moved in the second direction with a new chamber module.

BRIEF DESCRIPTION OF THE DRAWINGS

Embodiments of the present disclosure will be described below as examples with reference to the accompanying drawings.

FIG. 24 is a side view illustrating a state in which the chamber module is disposed at the module pull-out position in the maintenance region, and partially includes a cross-sectional view.

DESCRIPTION OF EMBODIMENTS

Contents

1. Overall description of extreme ultraviolet light generation apparatus and exposure apparatus in combination
    1.1 Configuration
    1.2 Operation
2. Description of maintenance work
    2.1 Configuration for moving EUV light generation chamber device to maintenance region
    2.2 Operation
    2.3 Configuration for tilting up optical base
    2.4 Operation
    2.5 Configuration for separating chamber from optical base
    2.6 Operation
3. Problem
4. Embodiment 1
    4.1 Configuration
    4.2 Operation performed when chamber module is replaced
        4.2.1 State in which optical base and chamber module are united with each other
        4.2.2 State in which optical base is positioned in maintenance region
        4.2.3 State in which chamber module is disposed at module pull-out position in maintenance region
        4.2.4 State in which chamber module is placed on dedicated trolley
        4.2.5 Description of situation in which chamber module is moved using dedicated trolley
    4.3 Exemplary configuration 1 of coupling part between optical base and chamber module
    4.4 Exemplary configuration 2 of coupling part between optical base and chamber module
    4.5 Description of maintenance method
    4.6 Guarantee of optical axis
        4.6.1 Configuration
        4.6.2 Optical axis adjustment process before chamber module shipment
        4.6.3 Work in field after chamber module shipment
    4.7 Effect
5. Embodiment 2
    5.1 Configuration
    5.2 Operation
    5.3 Effect Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Overall Description of Extreme Ultraviolet Light Generation Apparatus and Exposure Apparatus in Combination

1.1 Configuration

Figure 1:
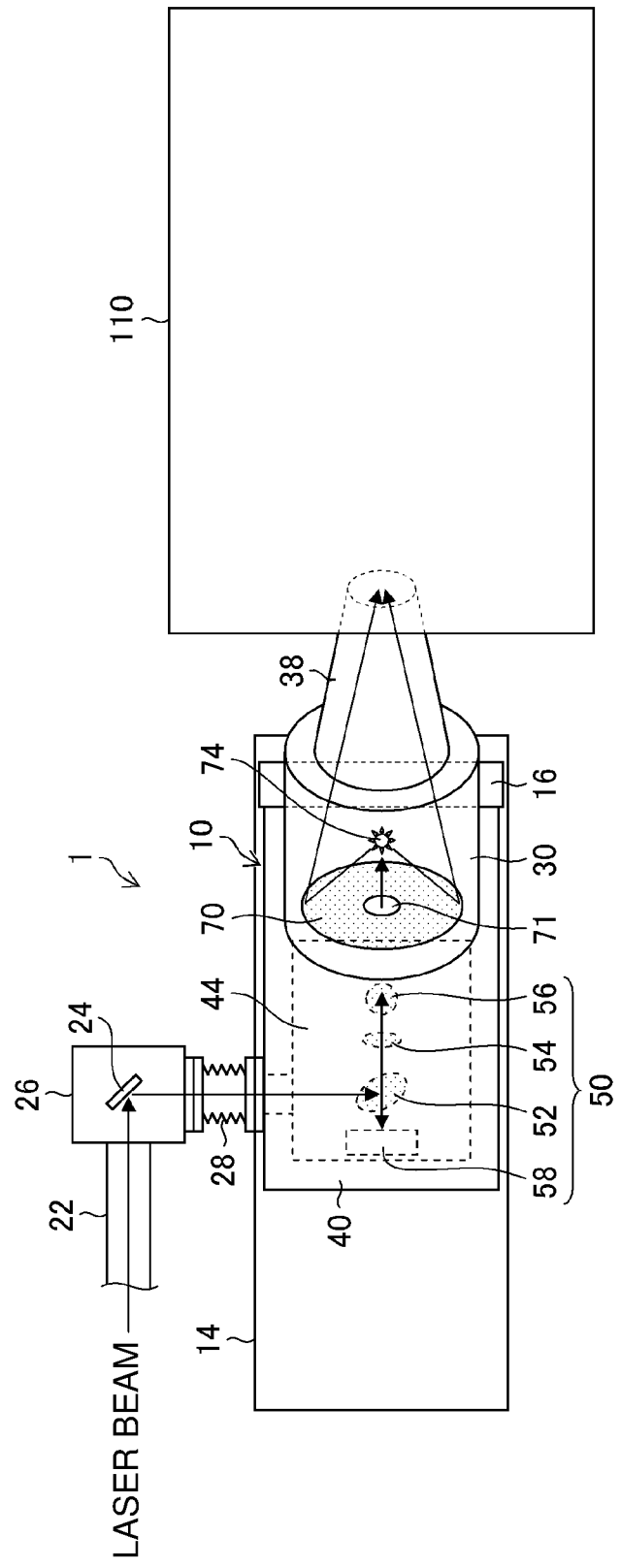
FIG. 1 is a plan view exemplarily illustrating a schematic configuration of an extreme ultraviolet light generation apparatus connected with an exposure apparatus, and partially includes a perspective view.
Figure 2:
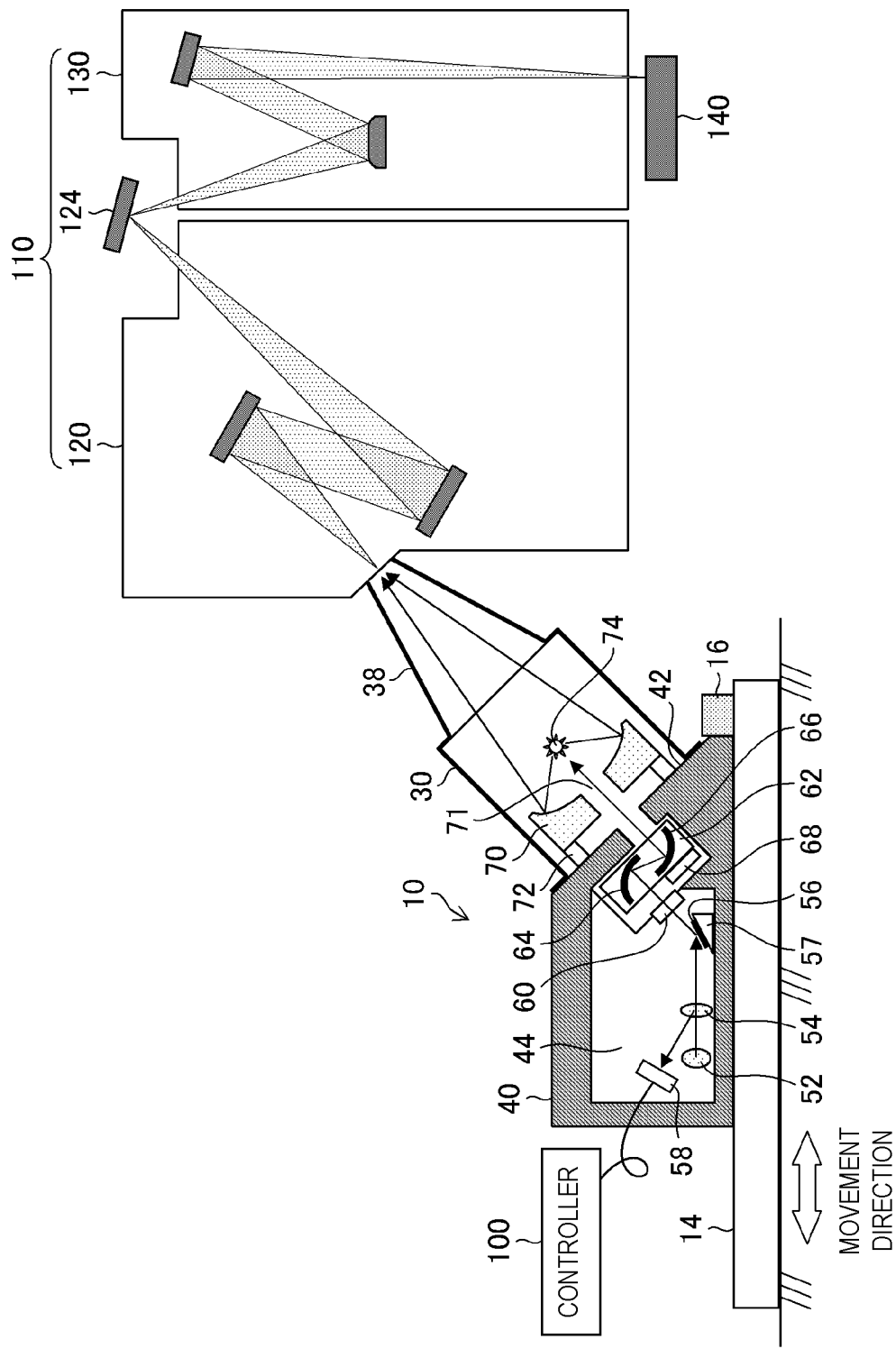
FIG. 2 is a side view exemplarily illustrating a schematic configuration of the extreme ultraviolet light generation apparatus connected with the exposure apparatus, and partially includes a cross-sectional view.

FIGS. 1 and 2 exemplary illustrate a schematic configuration of an extreme ultraviolet light generation apparatus connected with an exposure apparatus. FIG. 1 is a plan view, and partially includes a perspective view. FIG. 2 is a side view, and partially includes a cross-sectional view. This EUV light generation apparatus 1 employs the LPP scheme. The EUV light generation apparatus 1 includes an EUV light generation chamber device 10, a movement mechanism 14, and a positioning-fixation mechanism 16. The EUV light generation apparatus 1 also includes a laser beam introduction pipe 22 through which a laser beam output from a laser apparatus (not illustrated) passes, a laser beam transmission unit 26 in which a first high reflectance mirror 24 is disposed, and a flexible pipe 28. The laser apparatus is denoted by reference sign 20 in FIG. 3.

The EUV light generation chamber device 10 includes a chamber 30, an optical base 40, a laser beam introduction optical system 50, a window 60, a laser beam condensation optical system 62, and an EUV light condenser mirror 70. The chamber 30 is a sealable vacuum container in which EUV light is generated. The chamber 30 is connected with an exhaust device (not illustrated) and a gas supply device (not illustrated).

The optical base 40 is a base frame for fixing the chamber 30 and various optical components such as the laser beam introduction optical system 50, the window 60, the laser beam condensation optical system 62, and the EUV light condenser mirror 70. The optical base 40 includes a tilted surface 42. The chamber 30 is fixed to the tilted surface 42 of the optical base 40. The tilted surface 42 serves as a fixation reference surface for the chamber 30 and the EUV light condenser mirror 70.

The EUV light generation chamber device 10 is connected with the laser beam transmission unit 26 through the flexible pipe 28. FIG. 1 illustrates an example in which the laser beam transmission unit 26 is disposed at a side surface of the EUV light generation chamber device 10, and a laser beam is introduced into the EUV light generation chamber device 10 from the side surface side of the EUV light generation chamber device 10.

The disposition configuration of the laser beam transmission unit 26 is not limited to the example illustrated in FIG. 1. For example, the laser beam transmission unit 26 may be disposed below the EUV light generation chamber device 10 in the gravity direction and may introduce a laser beam into the EUV light generation chamber device 10 from below the EUV light generation chamber device 10. Alternatively, for example, the laser beam transmission unit 26 may be disposed at a side surface on a side opposite to the position illustrated in FIG. 1 with respect to the EUV light generation chamber device 10.

The laser beam introduction optical system 50 is disposed at an inside 44 of the optical base 40. The laser beam introduction optical system 50 includes a second high reflectance mirror 52, a beam splitter 54, a third high reflectance mirror 56, and a light meter 58.

The second high reflectance mirror 52 reflects, toward the beam splitter 54, a laser beam introduced into the inside 44 of the optical base 40 through the laser beam transmission unit 26.

The beam splitter 54 reflects part of the laser beam reflected by the second high reflectance mirror 52. The laser beam reflected by the beam splitter 54 is incident on the light meter 58. The light meter 58 measures the laser beam reflected by the beam splitter 54. The light meter 58 is connected with a controller 100.

The beam splitter 54 transmits part of the laser beam reflected by the second high reflectance mirror 52. The laser beam having transmitted through the beam splitter 54 is incident on the third high reflectance mirror 56. The third high reflectance mirror 56 includes a flap stage 57 that can adjust the angle of the reflective surface thereof. The flap stage 57 is an electric automatic stage operated by an actuator. The flap stage 57 is connected with a controller (not illustrated). Alternatively, the flap stage 57 may be connected with the controller 100. The angle of the reflective surface of the third high reflectance mirror 56 is adjusted to reflect the incident laser beam toward the window 60. The third high reflectance mirror 56 is called a "tilt mirror" in some cases.

The laser beam reflected by the third high reflectance mirror 56 is incident on the window 60. The window 60 transmits, into the chamber 30, the laser beam incident through the third high reflectance mirror 56. The window 60 has a function to seal up the chamber 30 to maintain the inside of the chamber 30 at a pressure lower than the atmospheric pressure. Specifically, the window 60 is fixed to the optical base 40 while being sealed to block an opening that is provided to the optical base 40 and through which the laser beam passes. The window 60 may be, for example, a diamond window.

The laser beam having transmitted through the window 60 is introduced into the chamber 30 through the laser beam condensation optical system 62. The laser beam condensation optical system 62 includes a fourth high reflectance mirror 64 and a laser beam condenser mirror 66. The laser beam condensation optical system 62 is fixed to the optical base 40 through a condensation optical system stage 68. The condensation optical system stage 68 may be, for example, an XYZ stage. The XYZ stage is a three-axis stage movable in three axial directions along an X axis, a Y axis, and a Z axis orthogonal to each other. The condensation optical system stage 68 is an electric automatic stage operated by an actuator and is connected with a controller (not illustrated). Alternatively, the condensation optical system stage 68 may be connected with the controller 100.

The EUV light condenser mirror 70 is disposed in the chamber 30 and fixed to the tilted surface 42 of the optical base 40 through a holder 72. The EUV light condenser mirror 70 is an elliptical surface mirror having a rotational spheroidal reflective surface. The EUV light condenser mirror 70 has a first focal point positioned in a plasma generation region 74 and has a second focal point positioned at an intermediate focusing point IF.

The EUV light generation chamber device 10 is disposed on the movement mechanism 14. The movement mechanism 14 moves the EUV light generation chamber device 10 between a predetermined position to which positioning is performed by the positioning-fixation mechanism 16 and a maintenance region in which maintenance work can be performed. The movement mechanism 14 is fixed on a floor at a site where the EUV light generation apparatus 1 is installed.

The EUV light generation chamber device 10 is connected with an exposure apparatus 110 while being positioned to the predetermined position by the positioning-fixation mechanism 16.

The exposure apparatus 110 includes an illumination optical system 120, a reflective mask 124, a projection optical system 130, and a wafer stage 140. The illumination optical system 120 and the projection optical system 130 each include a plurality of mirrors.

The positioning-fixation mechanism 16 positions and fixes the optical base 40 on the movement mechanism 14 so that the chamber 30 is positioned to a predetermined position where the optical axis of EUV light emitted from the EUV light condenser mirror 70 is aligned with the optical axes of the illumination optical system 120 and the projection optical system 130. Various kinds of components such as a stopper member, a positioning pin, and a six-axis axial stage can be used as the positioning-fixation mechanism 16.

Figure 3:
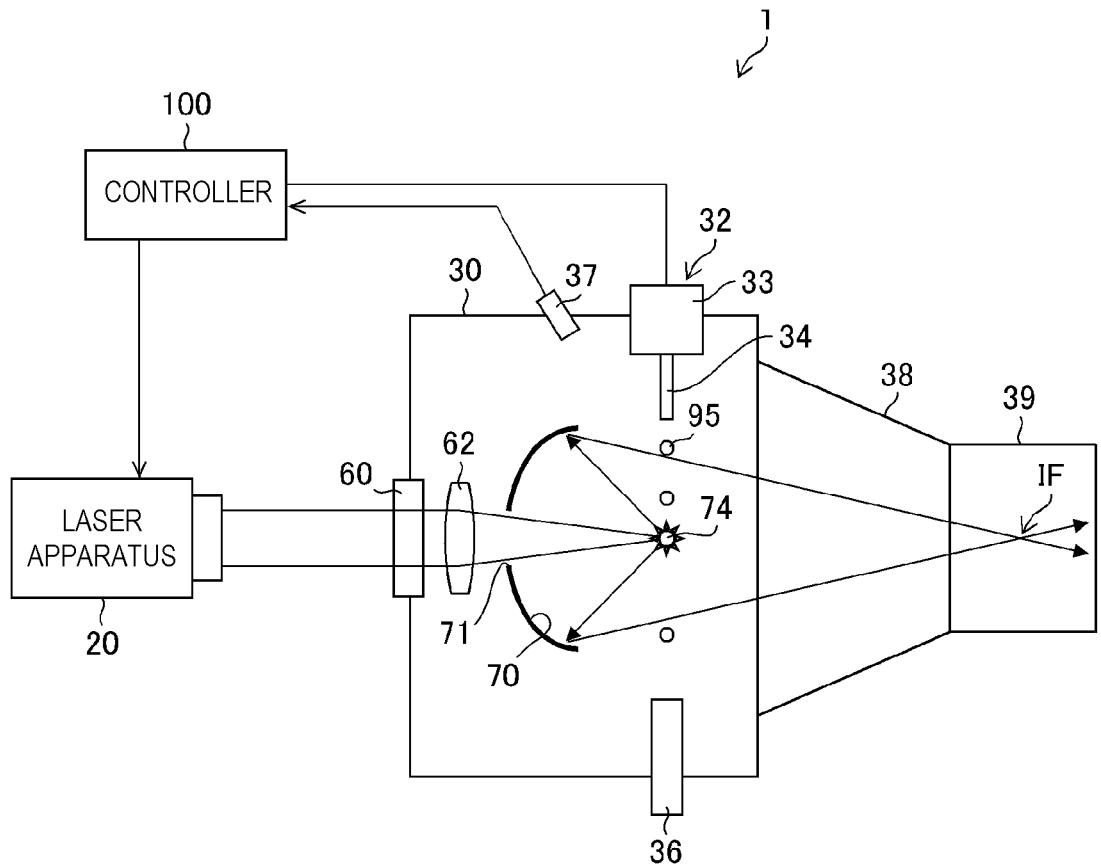
FIG. 3 is a pattern diagram illustrating an overview of a chamber and peripheral devices included in an exemplary LPP EUV light generation apparatus.

FIG. 3 is a pattern diagram illustrating an overview of the chamber 30 and peripheral devices included in the exemplary LPP EUV light generation apparatus 1. The EUV light generation apparatus 1 is used together with a laser apparatus 20. The laser apparatus 20 may be included in the EUV light generation apparatus 1.

The EUV light generation apparatus 1 includes a droplet generator 32, a droplet catcher 36, and a droplet measurement sensor 37. The EUV light generation apparatus 1 also includes a chamber connection pipe 38 and a flexible pipe 39 covering the optical path of EUV light condensed by the EUV light condenser mirror 70.

The droplet generator 32 is a device configured to supply, into the chamber 30, a target substance used to generate EUV light. The droplet generator 32 configured to supply a droplet 95 of the target substance to the plasma generation region 74 is disposed in the chamber 30.

The droplet generator 32 is attached to, for example, penetrate through a wall of the chamber 30. The material of the target substance may contain tin, terbium, gadolinium, lithium, xenon, or a combination of two or more thereof, but not limited thereto.

The droplet generator 32 includes a tank 33 in which the target substance is stored, and a nozzle 34 including a nozzle hole through which the target substance is output. The tank 33 may be formed in a hollow tubular shape. The tank 33 houses the target substance inside. At least the inside of the tank 33 is made of a material unlikely to react with the target substance. Examples of materials unlikely to react with tin as an exemplary target substance include SiC, $SiO_2$, $Al_2O_3$, molybdenum, tungsten, and tantalum. In addition, a heater (not illustrated) and a temperature sensor (not illustrated) are disposed at an outer side surface part of the tank 33.

The droplet generator 32 includes a pressure adjuster (not illustrated) configured to adjust the pressure in the tank 33. The pressure adjuster is disposed at a pipe between an inert gas supply unit (not illustrated) and the tank 33. The inert gas supply unit may include a gas tank filled with inert gas such as helium or argon. The inert gas supply unit can supply the inert gas into the tank 33 through the pressure adjuster. The droplet generator 32 is connected with the controller 100.

The nozzle hole of the nozzle 34 is formed in a shape with which the target substance being melted is ejected in a jet form into the chamber 30. An exemplary target substance output from the nozzle hole may be liquid tin, which is melted metal. A piezoelectric element (not illustrated) is disposed at the nozzle 34. The piezoelectric element disposed at the nozzle 34 is an exemplary vibration device configured to provide, to the nozzle 34, vibration necessary for forming the droplet 95. The piezoelectric element is connected with a piezoelectric power source (not illustrated). The piezoelectric power source supplies electrical power to the piezoelectric element. The piezoelectric power source is connected with the controller 100, and the electrical power supply to the piezoelectric element is controlled by the controller 100.

The droplet generator 32 forms the droplet 95 by, for example, a continuous jet scheme. In the continuous jet scheme, the nozzle 34 is vibrated to provide standing wave to flow of the target substance ejected in a jet form, thereby periodically separating the target substance. Each separated target substance can form into the droplet 95 by forming a free interface due to the surface tension thereof. The droplet generator 32 is an exemplary target supply unit.

The droplet catcher 36 is disposed at a position facing the droplet generator 32. Part of the target substance supplied from the droplet generator 32 into the chamber 30, which is not irradiated with a laser beam and no longer necessary, is collected by the droplet catcher 36.

The droplet measurement sensor 37 detects one or a plurality of the existence, locus, position, and speed of the droplet 95 output into the chamber 30. The droplet measurement sensor 37 may be configured by any of an image sensor such as a photodiode, a photodiode array, an avalanche photodiode, a photomultiplier, a multi-pixel photon counter, or a charge-coupled device (CCD) camera, and an image intensifier.

The droplet measurement sensor 37 may have, for example, a configuration including a light source unit and a light receiving unit. The light source unit and the light receiving unit may be disposed at positions facing each other with the trajectory of the droplet 95 interposed therebetween. FIG. 3 illustrates only one droplet measurement sensor 37, but a plurality of droplet measurement sensors 37 may be disposed in the chamber 30.

Although not illustrated, one or a plurality of EUV optical sensors for measuring the energy of EUV light generated in the chamber 30 are disposed in the chamber 30.

The laser apparatus 20 is a master oscillator power amplifier type laser apparatus configured to generate a drive laser beam used to excite the target substance. For example, the laser apparatus 20 may include a master oscillator, an optical isolator, and a plurality of $CO_2$ laser amplifiers. The laser apparatus 20 is called a "driver laser" in some cases.

The laser beam generated by the laser apparatus 20 is introduced to the EUV light generation chamber device 10 through the laser beam transmission unit 26 described with reference to FIG. 1. The laser beam having transmitted through the window 60 is condensed to form a focal point on the trajectory of the target substance in the chamber 30 through the laser beam condensation optical system 62.

For simplification of illustration, FIG. 3 omits illustration of the laser beam introduction optical system 50 illustrated in FIG. 1, and schematically illustrates the laser beam condensation optical system 62 as one lens. The laser beam condensation optical system 62 includes at least one lens and/or at least one mirror.

Plasma is generated by irradiating the target substance with the laser beam condensed through the laser beam condensation optical system 62. The generated plasma radiates light having various wavelengths containing EUV light.

The reflective surface of the EUV light condenser mirror 70 is coated with a multi-layered film configured to reflect, at high reflectance, EUV light having a predetermined wavelength component (for example, 13.5 nm) in the light radiated from the plasma and having various wavelengths. For example, a multi-layer reflective film in which molybdenum and silicon are alternately stacked is formed on the reflective surface of the EUV light condenser mirror 70. The EUV light condenser mirror 70 is provided with a through-hole 71 at a central part thereof through which a laser beam passes.

The EUV light condenser mirror 70 is disposed so that the position of the first focal point thereof is in the plasma generation region 74, and EUV light is condensed at the position of the second focal point as the intermediate focusing point (IF) of the EUV light condenser mirror 70. The plasma generation region 74 includes the position of an emission point of the EUV light, in other words, a plasma point.

The EUV light generation apparatus 1 includes the chamber connection pipe 38 and the flexible pipe 39 that provide communication between the inside of the chamber 30 and the inside of the exposure apparatus 110. The chamber connection pipe 38 is connected with the chamber 30. The chamber connection pipe 38 is connected with the illumination optical system 120 of the exposure apparatus 110 through the flexible pipe 39. FIGS. 1 and 2 omit illustration of the flexible pipe 39.

A gate valve (not illustrated) may be provided at a connection part between the chamber connection pipe 38 and the flexible pipe 39. In addition, another gate valve (not illustrated) may be provided at a connection part between the illumination optical system 120 and the flexible pipe 39.

A wall through which an aperture (not illustrated) is formed is provided inside the flexible pipe 39. The aperture (not illustrated) is positioned at the intermediate focusing point IF as the position of the second focal point of the EUV light condenser mirror 70.

The controller 100 collectively controls the entire EUV light generation apparatus 1. The controller 100 is connected with each of the laser apparatus 20, the droplet generator 32, and the droplet measurement sensor 37. The controller 100 functions as an EUV light generation control device.

The controller 100 controls operation of the droplet generator 32. The controller 100 also controls the laser beam output timing of the laser apparatus 20 based on a detection signal from the droplet measurement sensor 37. The controller 100 generates a laser trigger signal that specifies the laser beam output timing of the laser apparatus 20. In addition, the controller 100 controls, for example, the laser beam traveling direction and focusing position of the laser apparatus 20.

The controller 100 controls, for example, a period in which the droplet 95 is output and the speed of the droplet 95 based on the detection signal from the droplet measurement sensor 37. These various kinds of control are merely exemplary, and may include other control as necessary, or part of the control function may be omitted.

The controller 100 may control operation of the flap stage 57 described with reference to FIG. 2. In the present disclosure, control devices such as the controllers 100, 102, and 106 and a control unit of the exposure apparatus 110 can be achieved by hardware and software combination of one or a plurality of computers. The software is synonymous with a computer program. The computers conceptually include a programmable controller.

Functions of a plurality of control devices can be achieved by a single control device. In addition, in the present disclosure, the controllers 100, 102, and 106, the control unit of the exposure apparatus 110, and the like may be connected with each other through communication networks such as a local area network and the Internet. In a distributed computing environment, a computer program unit may be stored in both local and remote memory storage devices.

1.2 Operation

The following describes operation of the exemplary LPP EUV light generation apparatus 1 with reference to FIGS. 1 to 3. The controller 100 controls gas discharge from the exhaust device (not illustrated) and gas supply from the gas supply device so that the pressure in the chamber 30 is in a predetermined range. The controller 100 controls the gas discharge and supply of the chamber 30 so that, for example, the pressure in the chamber 30 is several pascal [Pa] to several hundred pascal [Pa].

The controller 100 controls the heater (not illustrated) provided to the tank of the droplet generator 32 to heat the target substance in the tank to a predetermined temperature equal to or higher than the melting point thereof. When the target substance is tin, the controller 100 controls the heater (not illustrated) to heat tin in the tank to a predetermined temperature in the temperature range of 250° C. to 290° C., which is higher than the melting point thereof, thereby adjusting the temperature of tin in the tank. The melting point of tin is 232° C.

In addition, the controller 100 controls the pressure adjuster so that the pressure in the tank becomes equal to a pressure at which a jet of liquid tin can be output from the nozzle 34 at a predetermined speed. The controller 100 transmits a signal that supplies voltage having a predetermined waveform to the piezoelectric element (not illustrated) so that the droplet 95 is generated. When supplied with voltage having the predetermined waveform, the piezoelectric element vibrates. Accordingly, a jet of melted tin is divided into droplets 95 so that the droplets 95 having substantially same volume are periodically generated.

The droplet measurement sensor 37 includes, for example, the light source unit and the light receiving unit (not illustrated). Illumination light output from the light source unit passes through a predetermined position on a droplet trajectory on which each droplet 95 travels, and is received by the light receiving unit.

Light intensity received by the light receiving unit decreases in synchronization with the passing of the droplet 95 through the predetermined position. This change in the light intensity is detected by the light receiving unit, and a result of the detection is output from the light receiving unit to the controller 100.

When the droplet 95 is to be irradiated with a pulse laser beam, the controller 100 generates a droplet detection signal at a timing at which the detection signal obtained from the droplet measurement sensor 37 becomes smaller than a threshold voltage. The controller 100 outputs a light emission trigger signal delayed from the droplet detection signal by a predetermined time to the laser apparatus 20. This delay time is set for the laser apparatus 20 so that the droplet 95 is irradiated with the pulse laser beam when the droplet 95 reaches the plasma generation region 74.

When the light emission trigger signal has been input to the laser apparatus 20, a laser beam is output from the laser apparatus 20. The laser beam output from the laser apparatus 20 is introduced into the EUV light generation chamber device 10 through the laser beam introduction pipe 22 and the first high reflectance mirror 24, and is incident on the second high reflectance mirror 52. Part of the laser beam, which is reflected by the second high reflectance mirror 52 transmits through the beam splitter 54 and is incident on the third high reflectance mirror 56.

Part of the laser beam, which is reflected by the beam splitter 54 is incident on the light meter 58. The light meter 58 measures, for example, the pointing and position of the laser beam. This information obtained by the light meter 58 is transferred to the controller 100.

The controller 100 may control a laser beam path control mechanism (not illustrated) based on the output from the light meter 58. The controller 100 may also control the condensation optical system stage 68 based on an output from a laser irradiation position sensor (not illustrated).

The laser beam reflected by the third high reflectance mirror 56 passes through the window 60 and is incident on the laser beam condensation optical system 62.

The laser beam having transmitted through the window 60 is reflected by the laser beam condenser mirror 66 through the third high reflectance mirror 56 and the fourth high reflectance mirror 64. The laser beam reflected by the laser beam condenser mirror 66 passes through a through-hole of the optical base 40 and the through-hole 71 of the EUV light condenser mirror 70 and is condensed to the plasma generation region 74.

When supplied to the plasma generation region 74, the droplet 95 output from the droplet generator 32 is irradiated with the condensed laser beam. As a result, plasma is generated from the target substance and radiates radiation light. EUV light contained in the radiation light is selectively reflected by the EUV light condenser mirror 70. Having been reflected by the EUV light condenser mirror 70, the EUV light is condensed at the intermediate focusing point (IF) and incident in the exposure apparatus 110. One droplet 95 may be irradiated with a plurality of laser pulses.

The illumination optical system 120 of the exposure apparatus 110 shapes the incident EUV light and illuminates the reflective mask 124 with the shaped EUV light. The reflective mask 124 outputs, to the projection optical system 130, reflected light on which a circuit pattern is reflected. The projection optical system 130 projects the circuit pattern onto a wafer placed on the wafer stage 140.

The droplet catcher 36 collects any droplet 95 not irradiated with the laser beam and having passed through the plasma generation region 74, and any droplet part not diffused through irradiation with the laser beam.

2. Description of Maintenance Work

Figure 4:
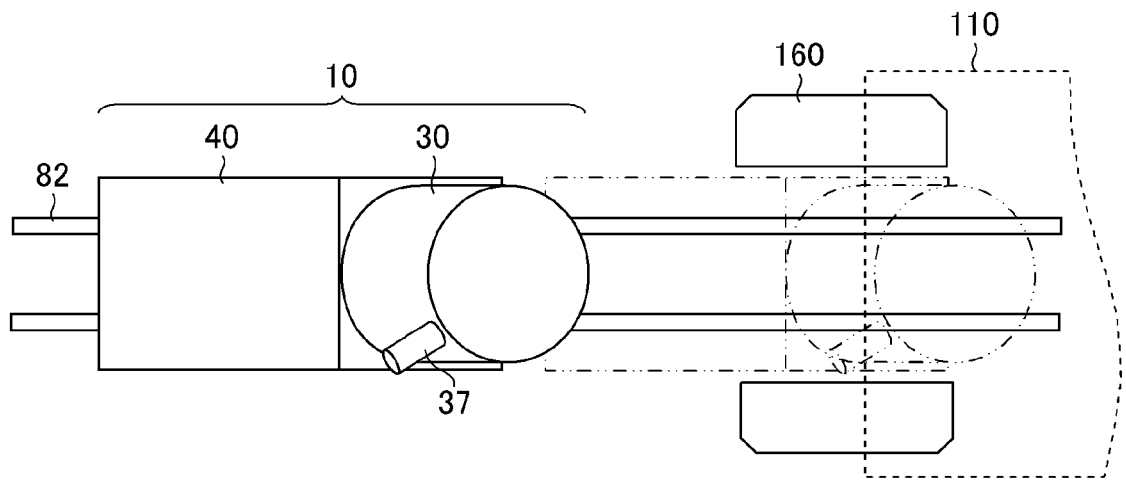
FIG. 4 is a plan view schematically illustrating a situation in which an EUV light generation chamber device is moved to a maintenance region.
Figure 5:
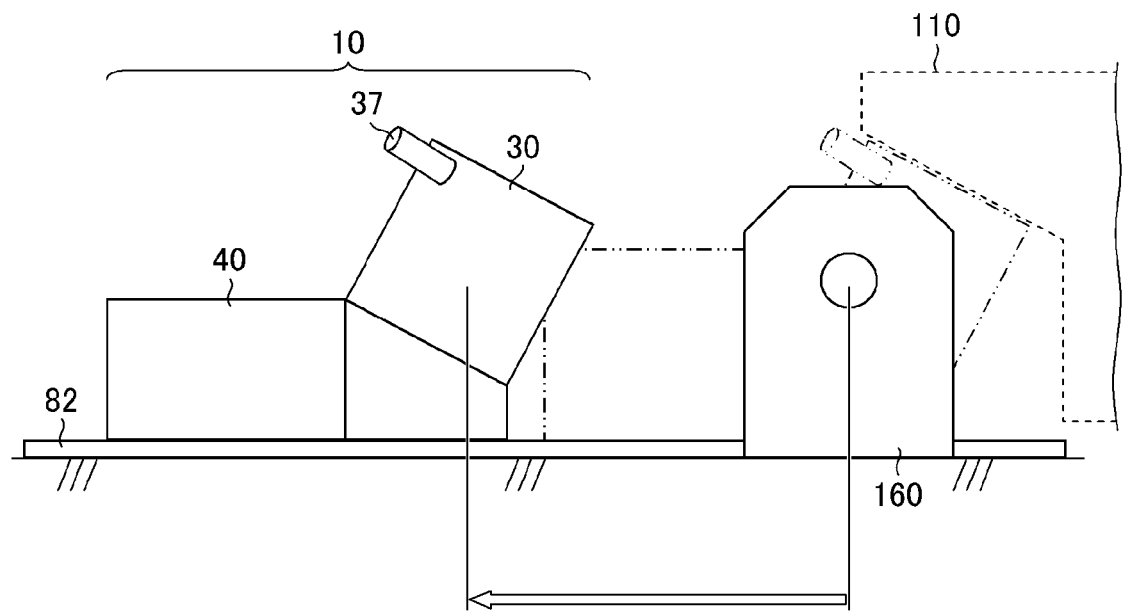
FIG. 5 is a side view schematically illustrating the situation in which the EUV light generation chamber device is moved in the maintenance region.

2.1 Configuration for Moving EUV Light Generation Chamber Device to Maintenance Region FIGS. 4 and 5 are diagrams schematically illustrating a situation in which the EUV light generation chamber device 10 is moved to the maintenance region. FIG. 4 is a plan view, and FIG. 5 is a side view. The movement mechanism 14 includes rails 82. The EUV light generation chamber device 10 is movable along the rails 82. When maintenance is to be performed, the EUV light generation chamber device 10 is moved to the maintenance region along the rails 82 as illustrated in FIGS. 4 and 5. In FIGS. 4 and 5, a dashed and double-dotted line illustrates a state in which the chamber 30 is positioned to a predetermined position where the chamber 30 is aligned with the optical axis of the exposure apparatus 110.

The EUV light generation apparatus 1 includes a pair of magnets 160. The pair of magnets 160 are superconductive magnets that generate a magnetic field for trapping charged particles generated from plasma generated in the chamber 30, thereby preventing degradation of the EUV light condenser mirror 70. The pair of magnets 160 are disposed at positions facing each other with interposed therebetween the chamber 30 being connected with the exposure apparatus 110.

The EUV light generation chamber device 10 including the chamber 30 and the optical base 40 is movable relative to the exposure apparatus 110 and the magnets 160 along the rails 82.

2.2 Operation

The following describes work of replacing the EUV light condenser mirror 70 as exemplary maintenance work. When the magnets 160 are disposed on both sides of the chamber 30, maintenance work space is restricted. When maintenance work is to be performed, as illustrated in FIGS. 4 and 5, the EUV light generation chamber device 10 is separated from the exposure apparatus 110 and moved to the maintenance region along the rails 82 to ensure maintenance space.

The operation of moving the EUV light generation chamber device 10 to the maintenance region separated from the exposure apparatus 110 is referred to as "shift-out". The operation of moving the EUV light generation chamber device 10 from the maintenance region to a predetermined position where the EUV light generation chamber device 10 is connected with the exposure apparatus 110 is referred to as "shift-in".

After the EUV light generation chamber device 10 is moved to the maintenance region, the droplet measurement sensor 37 is removed from the chamber 30.

The chamber connection pipe 38 and the flexible pipe 39 described with reference to FIG. 3 may be separated from the chamber 30 before the EUV light generation chamber device 10 is moved to the maintenance region, or may be separated from the chamber 30 after the EUV light generation chamber device 10 is moved to the maintenance region. Part or all of the chamber connection pipe 38 may be kept being connected with the chamber 30.

2.3 Configuration for Tilting up Optical Base

Figure 6:
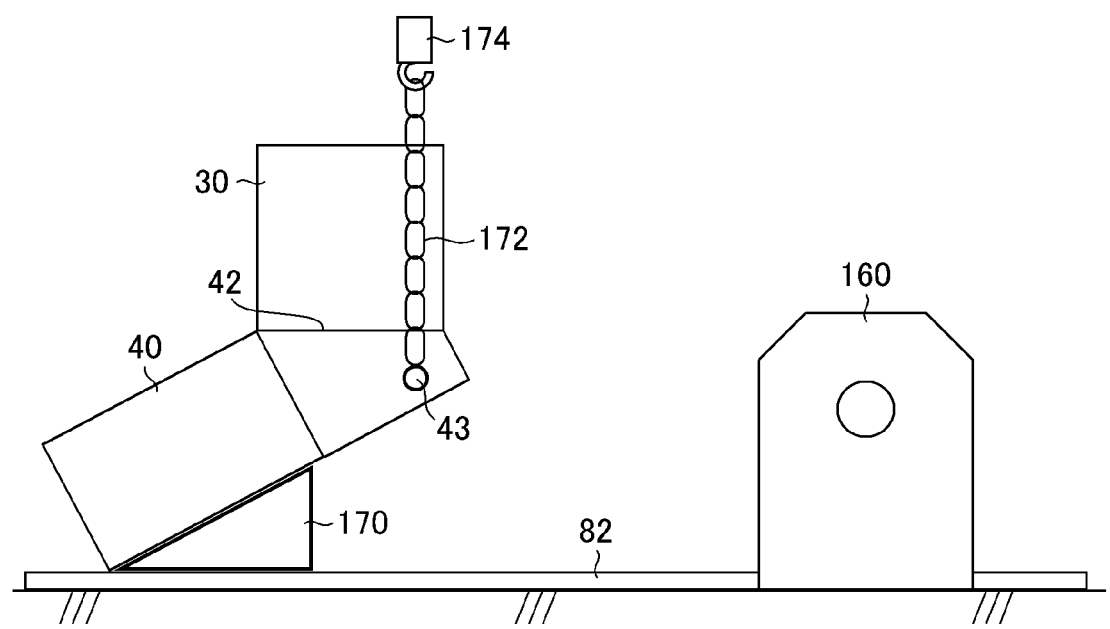
FIG. 6 is a diagram illustrating a state in which an optical base is tilted up by using a crane.

FIG. 6 illustrates a state in which the optical base 40 is tilted up so that the tilted surface 42 of the optical base 40 is horizontal.

The EUV light generation chamber device 10 includes a mechanism configured to make the chamber 30 horizontal with the optical base 40 as a pivot. For example, the optical base 40 includes a hanger portion 43 that can be used to hang the optical base 40 upward so that the tilted surface 42 becomes horizontal.

In addition, as illustrated in FIG. 6, an optical base support jig 170 is disposed between the optical base 40 and the movement mechanism 14 to hold the chamber 30 in the horizontal state.

2.4 Operation

A hanging attachment 172 such as a chain sling is coupled to the hanger portion 43 of the optical base 40, and the optical base 40 is hanged upward by a crane 174. The optical base support jig 170 is disposed below the optical base 40 being hung up by the crane 174, and the optical base 40 is placed on the optical base support jig 170. The optical base 40 is supported by the optical base support jig 170 so that the tilted surface 42 is held horizontal.

2.5 Configuration for Separating Chamber from Optical Base

Figure 7:
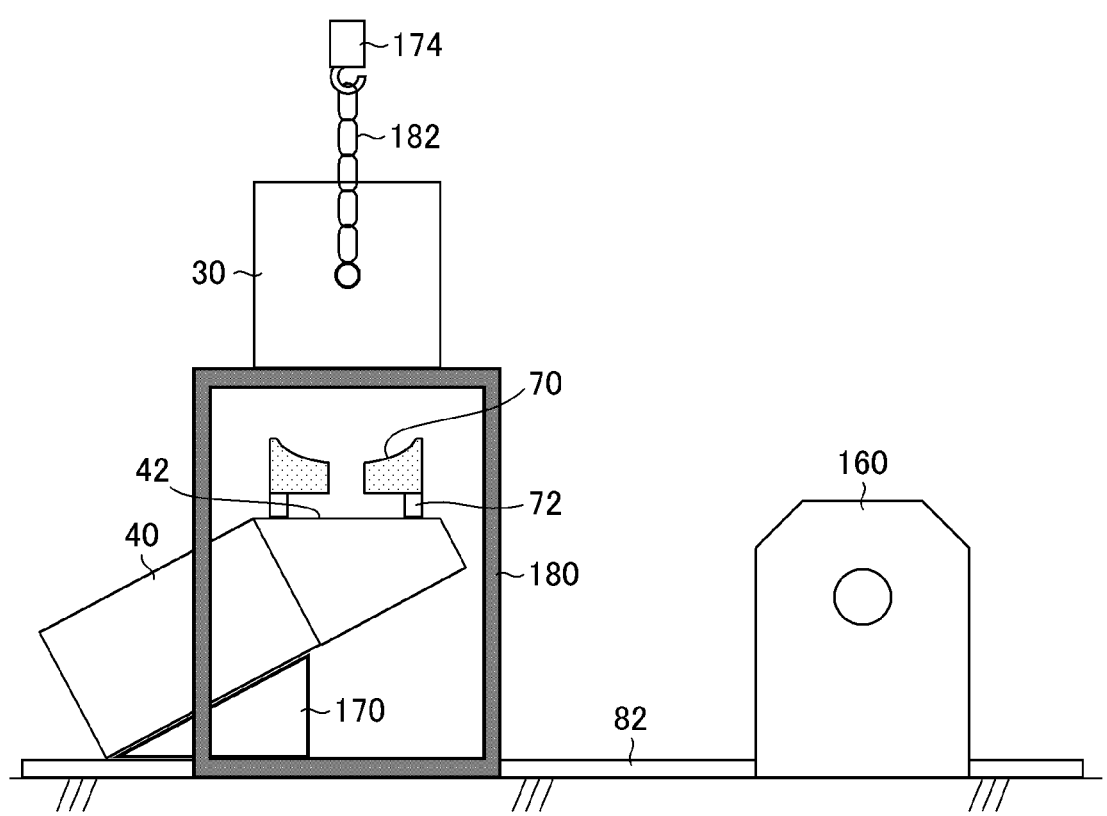
FIG. 7 is a side view illustrating a state in which the chamber is separated from the optical base.

FIG. 7 is a side view illustrating a state in which the chamber 30 is separated from the optical base 40. The EUV light generation apparatus 1 includes a mechanism configured to separate the chamber 30 from the optical base 40. The EUV light generation apparatus 1 also includes a mechanism configured to dispose a chamber support jig 180 below the chamber 30 so that the chamber 30 is held by the chamber support jig 180 after the chamber 30 is separated from the optical base 40.

2.6 Operation

As illustrated in FIG. 7, a hanging attachment 182 is coupled to the chamber 30, and the chamber 30 is hung upward by the crane 174. The chamber support jig 180 is disposed below the chamber 30 being hung up by the crane 174, and the chamber 30 is placed on the chamber support jig 180. The chamber 30 is supported by the chamber support jig 180 to ensure work space between the chamber 30 and the optical base 40. The EUV light condenser mirror 70 is exposed as the chamber 30 is separated from the optical base 40. Accordingly, an operator can access to the EUV light condenser mirror 70.

Thereafter, the EUV light condenser mirror 70 is removed from the optical base 40 and replaced with a new EUV light condenser mirror. The replacement work of the EUV light condenser mirror 70 includes, for example, separation work of a cooling water pipe, water removal work, and removal work of the temperature sensor.

After replacement with the new EUV light condenser mirror, a procedure opposite to that of the removal work is followed to unite the chamber 30 and the optical base 40 with each other and connect the EUV light generation chamber device 10 with the exposure apparatus 110.

3. Problem

As described with reference to FIGS. 4 and 5, in the EUV light generation apparatus 1, work (shift-out) of separating the EUV light generation chamber device 10 from the exposure apparatus 110 is performed to replace at least one of various optical components such as the window 60, the laser beam condensation optical system 62, and the EUV light condenser mirror 70. Thereafter, as described with reference to FIGS. 6 and 7, the chamber 30 is separated from the optical base 40 to expose any replacement target component so that the target component is accessible from the outside and replaced. After the replacement, the chamber 30 and the optical base 40 need to be united with each other again, and the EUV light generation chamber device 10 needs to be connected with the exposure apparatus 110.

The crane 174 is used to separate and unite the chamber 30 from and with the optical base 40. Replacement target components are water-cooled, and thus, water removal and water leakage check need to be performed on each target component when replacement is to be performed.

Work of separating or uniting the chamber 30 from or with the optical base 40 is work of handling heavy objects and thus needs time and manpower for setup and circumference check. When the chamber 30 is to be separated from the optical base 40, various sensors including the droplet measurement sensor 37 need to be separated from the chamber 30. Then, after the chamber 30 and the optical base 40 are united with each other, the various sensors need to be installed and readjusted. In addition, crane work is cumbersome. Thus, a long down time is needed.

For reference, Table 1 lists work items related to replacement work of the EUV light condenser mirror 70, and time taken for each work as an exemplary guide.

TABLE 1

| Work item | Required time |
|---|---|
| Removal of droplet measurement sensor | 0.5 h |
| Separation of chamber and optical base (using crane) | 4.5 h |
| Removal of EUV light condenser mirror | 2.4 h |
| Removal of laser beam condensation optical system (including stage) | 0.9 h |
| Removal and attachment of window | 1.4 h |
| Attachment of laser beam condensation optical system (including stage) | 3.3 h |
| Attachment of EUV light condenser mirror | 2.4 h |
| Uniting of chamber and optical base (using crane) | 5.1 h |
| Attachment and readjustment of droplet measurement sensor | 7.0 h |
| Total | 27.5 h |

As understood from the example of Table 1, the replacement work has an extremely long lead time.

4. Embodiment 1

4.1 Configuration

Figure 8:
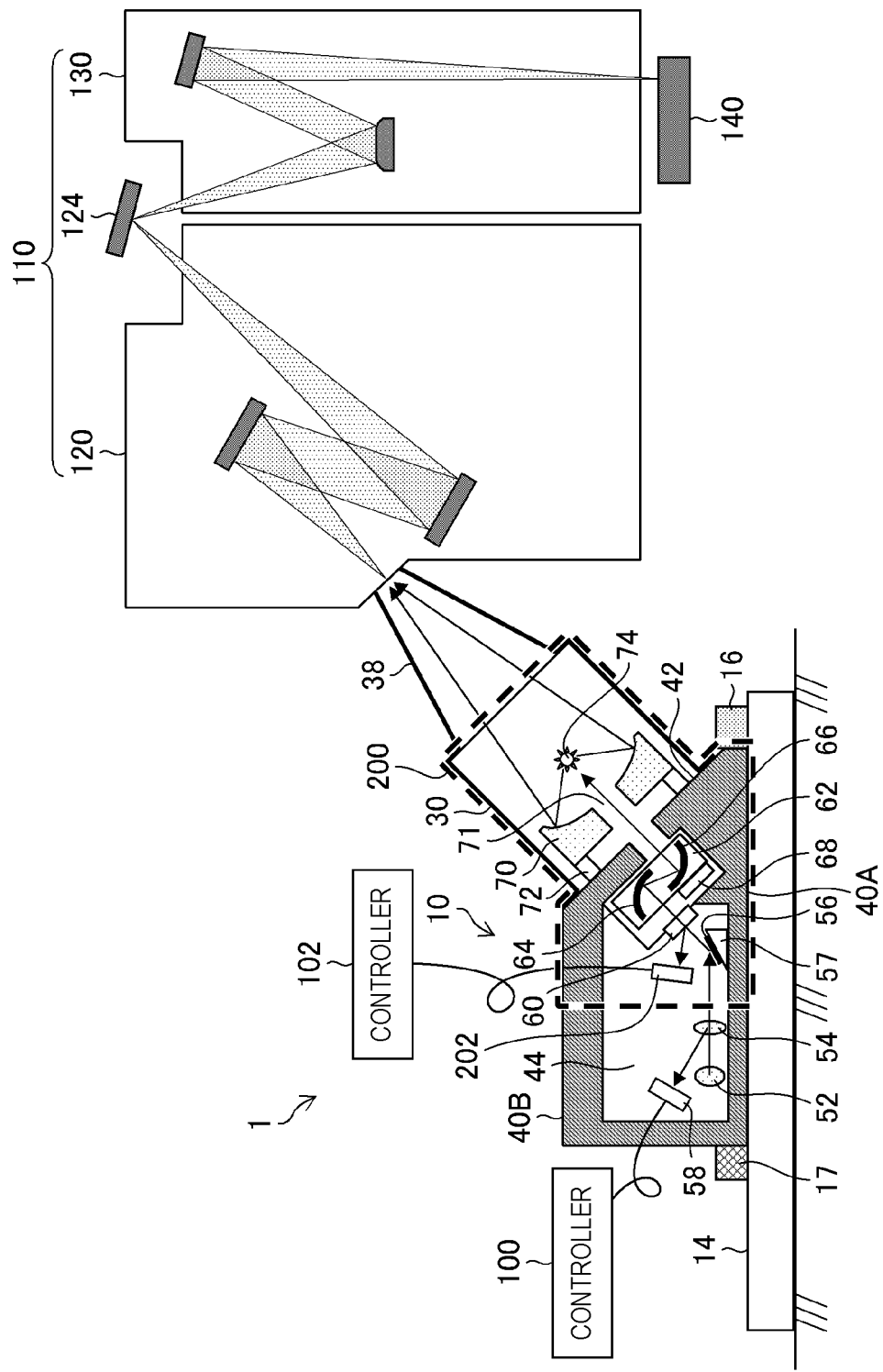
FIG. 8 is a side view schematically illustrating the configuration of an EUV light generation apparatus according to Embodiment 1, and partially includes a cross-sectional view.

FIG. 8 is a side view schematically illustrating the configuration of an EUV light generation apparatus according to Embodiment 1, and partially includes a cross-sectional view. The EUV light generation apparatus 1 according to Embodiment 1 is integrated with a part surrounded by a dashed line in FIG. 8 as a chamber module 200. The chamber module 200 includes the chamber 30, the EUV light condenser mirror 70, the laser beam condensation optical system 62, the condensation optical system stage 68, the window 60, the third high reflectance mirror 56, a light position sensor 202, and a chamber base 40A.

The light position sensor 202 is a position sensitive detector (PSD) configured to detect the position of reflected light from the window 60. The light position sensor 202 is connected with a controller 102.

When connected with an optical base 40B, the chamber base 40A functions as the optical base 40 described with reference to FIG. 2. In other words, in the EUV light generation apparatus 1 illustrated in FIG. 8, the optical base 40 is divided into the chamber base 40A and the optical base 40B, and the chamber base 40A and the optical base 40B can be separated from and united with each other.

The chamber 30, the EUV light condenser mirror 70, the laser beam condensation optical system 62, the condensation optical system stage 68, the window 60, the third high reflectance mirror 56, and the light position sensor 202 are fixed to the chamber base 40A.

The second high reflectance mirror 52, the beam splitter 54, and the light meter 58 are fixed to the optical base 40B.

When maintenance work is to be performed, the chamber base 40A and the optical base 40B can be separated and collectively replaced as the chamber module 200.

The EUV light generation apparatus 1 illustrated in FIG. 8 includes a positioning-fixation mechanism 17 configured to position and fix the optical base 40B to a predetermined position.

The EUV light condenser mirror 70 is an exemplary "condenser mirror". The third high reflectance mirror 56 is an exemplary "mirror configured to reflect a laser beam introduced from outside of the optical base so that the laser beam is incident on the window".

4.2 Operation Performed when Chamber Module is Replaced

Figure 9:
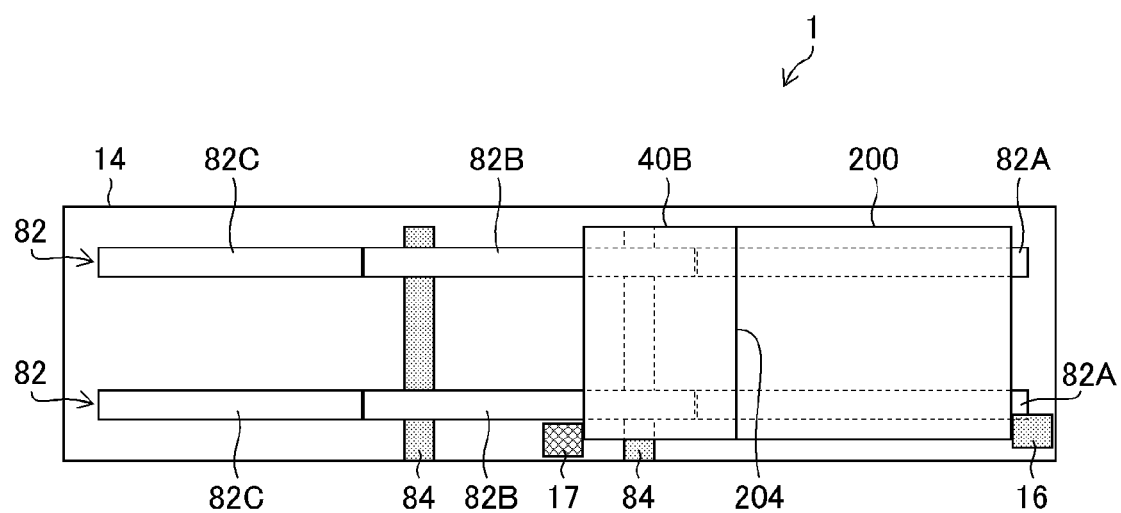
FIG. 9 is a plan view illustrating a state in which the optical base and a chamber module are united with each other.
Figure 10:
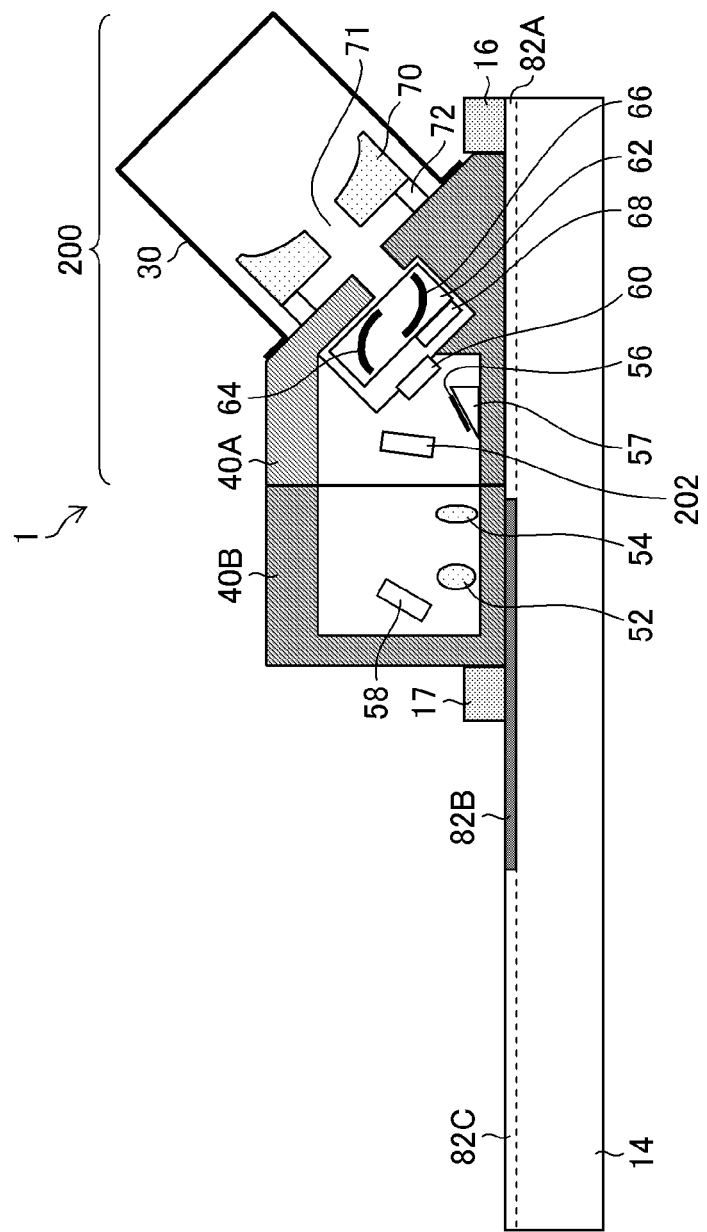
FIG. 10 is a side view of the state illustrated in FIG. 9, and partially includes a cross-sectional view.

4.2.1 State in which Optical Base and Chamber Module are United with Each Other FIGS. 9 and 10 are diagrams illustrating a state in which the optical base 40B and the chamber module 200 are united with each other. FIG. 9 is a plan view. FIG. 10 is a side view, and partially includes a cross-sectional view. FIG. 9 omits illustration of a partial shape of the chamber module 200. FIGS. 11, 13, 15, and 17 omit illustration of a partial shape of the chamber module 200 as well.

As illustrated in FIG. 9, the rails 82 that are parallel to a first direction as the longitudinal direction of the movement mechanism 14 are disposed in the movement mechanism 14. The lateral direction in FIG. 9 corresponds to the first direction. The rails 82 may be each, for example, a linear guide.

In the EUV light generation apparatus 1 according to Embodiment 1, each rail 82 has a divided configuration in which part of the rail 82 is separable so that the chamber module 200 can be slid in a second direction not parallel to the rail 82 of the movement mechanism 14.

In the example illustrated in FIG. 9, each rail 82 is divided into three parts in the first direction and accordingly, includes a first divided rail 82A, a second divided rail 82B, and a third divided rail 82C.

In addition, in the movement mechanism 14, two rails 84 are disposed in the second direction not parallel to the first direction. The second direction is preferably orthogonal to the first direction. The longitudinal direction in FIG. 9 corresponds to the second direction. Each rail 84 may be, for example, a linear guide. Although the movement mechanism 14 of the present example includes the rails 84 orthogonal to the rails 82, the rails 84 only need to be configured so that the chamber module 200 can be moved at least in a direction off the rails 82.

The rails 84 disposed along the second direction are fixed to the movement mechanism 14 so that the rails 84 intersect the second divided rails 82B. The second divided rails 82B are disposed on the rails 84 and movable along the rails 84. In other words, the second divided rails 82B are divided rail parts that are slidable in the second direction. The two second divided rails 82B may be coupled with each other at a predetermined interval by a structural body (not illustrated).

Each rail 82 is an exemplary "first mechanism" and corresponds to a "first rail". Each rail 84 is an exemplary "second mechanism" and corresponds to a "second rail". Each second divided rail 82B is an exemplary "divided rail as part of the first rail divided in the first direction".

A coupling part 204 between the optical base 40B and the chamber module 200 may couple and fix the optical base 40B and the chamber module 200 by using a coupling mechanism such as a bolt.

The positioning-fixation mechanism 17 fixes the optical base 40B by pressing the optical base 40B toward the chamber module 200. The positioning-fixation mechanism 17 may be omitted.

When fixation by the positioning-fixation mechanism 17 is canceled, the optical base 40B and the chamber module 200 can be moved to the maintenance region along the rails 82.

4.2.2 State in which Optical Base is Positioned in Maintenance Region

Figure 11:
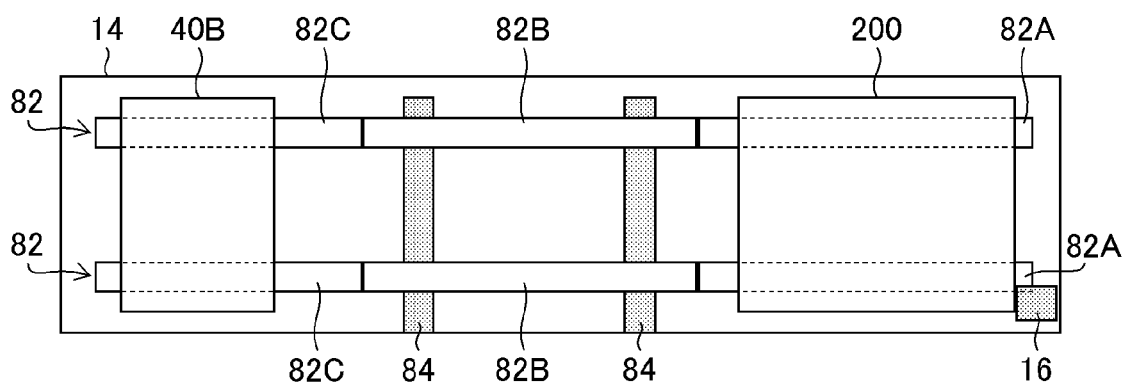
FIG. 11 is a plan view illustrating a state in which the optical base is positioned in the maintenance region and the chamber module is disposed at a predetermined position to which positioning is performed.
Figure 12:
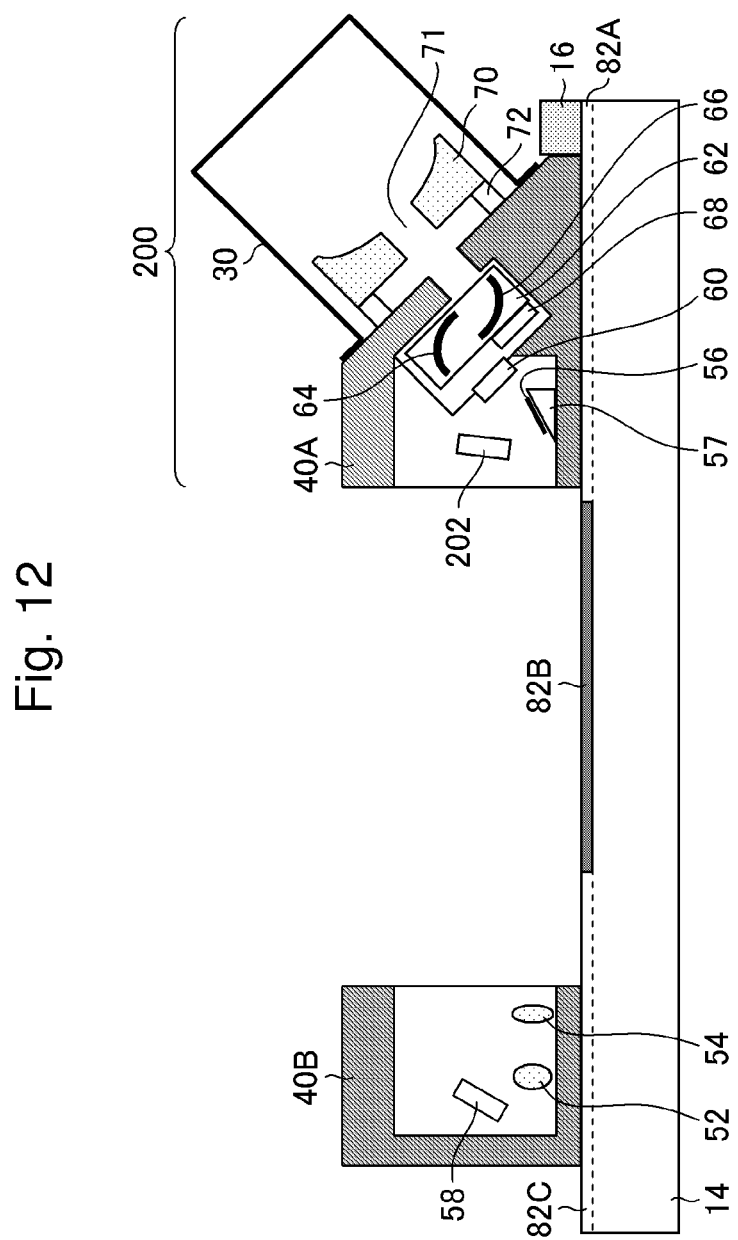
FIG. 12 is a side view of the state illustrated in FIG. 11, and partially includes a cross-sectional view.

FIGS. 11 and 12 are diagrams illustrating a state in which the optical base 40B is positioned in the maintenance region and only the chamber module 200 is disposed at a predetermined position to which positioning is performed by the positioning-fixation mechanism 16. FIG. 11 is a plan view. FIG. 12 is a side view, and partially includes a cross-sectional view.

When fixation by the positioning-fixation mechanism 16 is canceled, the chamber module 200 can be moved along the rails 82.

Figure 13:
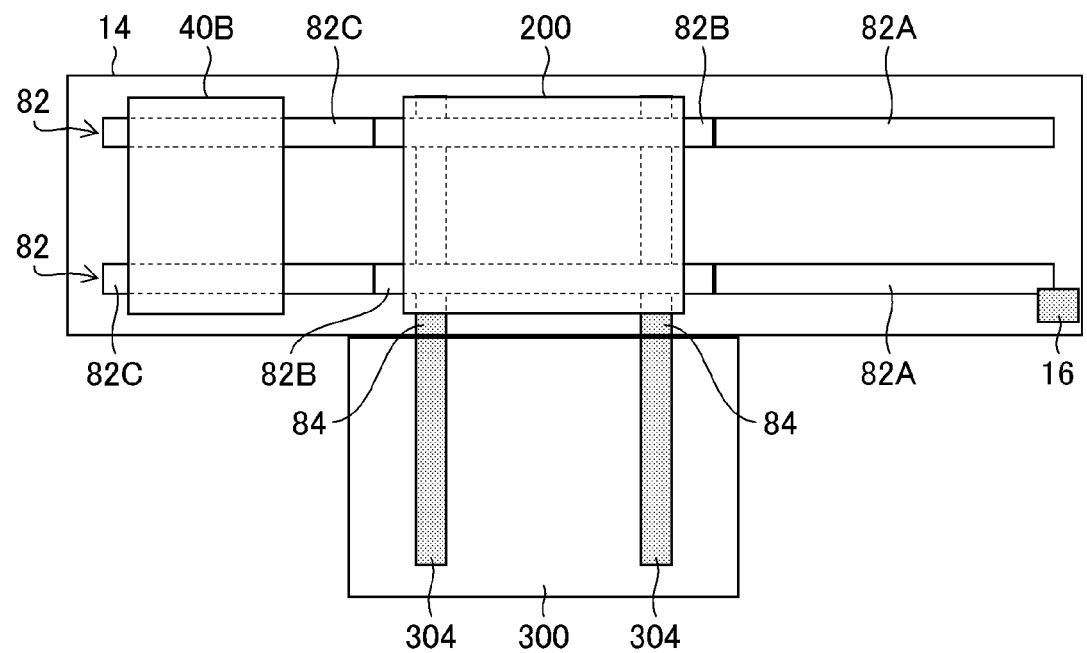
FIG. 13 is a plan view illustrating a state in which the chamber module is disposed at a module pull-out position in the maintenance region.
Figure 14:
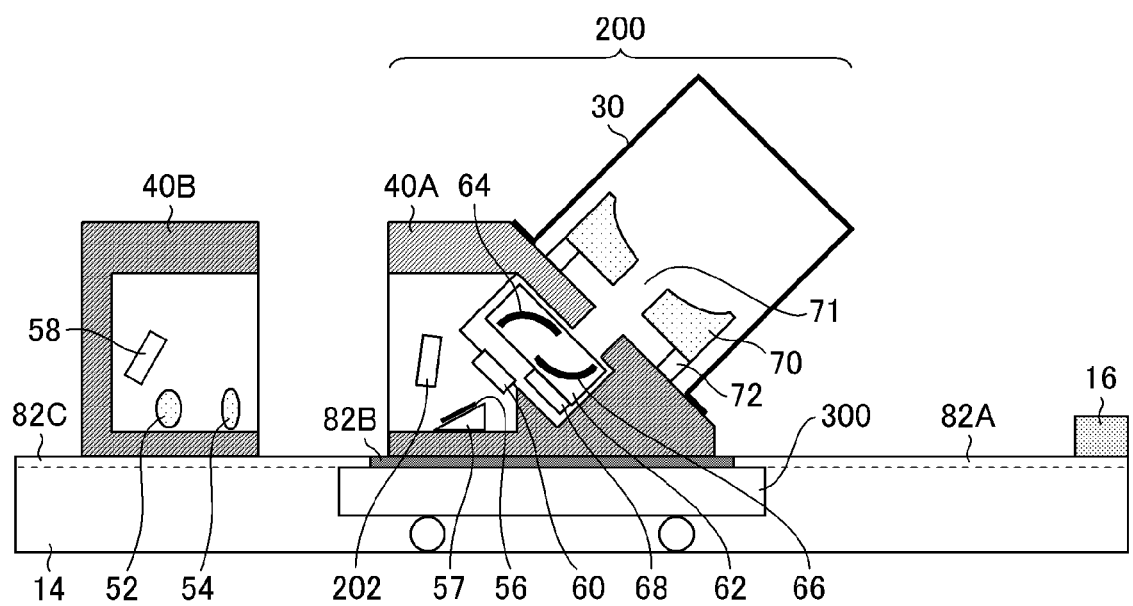
FIG. 14 is a side view of the state illustrated in FIG. 13, and partially includes a cross-sectional view.

4.2.3 State in which Chamber Module is Disposed at Module Pull-Out Position in Maintenance Region FIGS. 13 and 14 are diagrams illustrating a state in which the chamber module 200 is disposed at a module pull-out position in the maintenance region. FIG. 13 is a plan view. FIG. 14 is a side view, and partially includes a cross-sectional view.

When the chamber module 200 is to be replaced, the chamber module 200 is placed on the second divided rails 82B of the movement mechanism 14 and pulled out to a position from which the chamber module 200 is movable along the rails 84. The position from which the chamber module 200 is movable by the rails 84 is referred to as the module pull-out position. A dedicated trolley 300 is placed alongside the movement mechanism 14. The dedicated trolley 300 includes two rails 304 that are connectable with the rails 84 of the movement mechanism 14.

The dedicated trolley 300 is placed alongside the movement mechanism 14 so that the rails 304 of the dedicated trolley 300 are connected with ends of the rails 84 of the movement mechanism 14.

The dedicated trolley 300 is an exemplary "trolley including a third rail connectable with the second rail", and each rail 304 is an exemplary "third rail".

4.2.4 State in which Chamber Module is Placed on Dedicated Trolley

Figure 15:
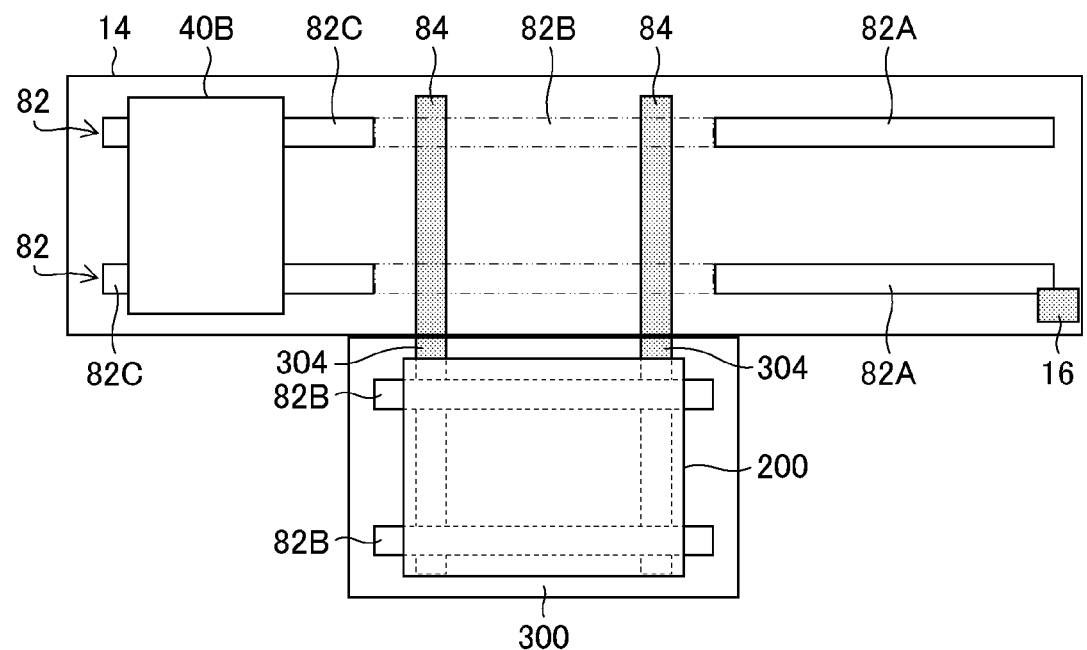
FIG. 15 is a plan view illustrating a state in which the chamber module is placed on a dedicated trolley.

FIG. 15 is a plan view illustrating a state in which the chamber module 200 is placed on the dedicated trolley 300. A side view corresponding to FIG. 15 is same as that of FIG. 14.

As illustrated in FIG. 15, the chamber module 200 together with the second divided rails 82B can be moved along the rails 84 and the rails 304.

Figure 16:
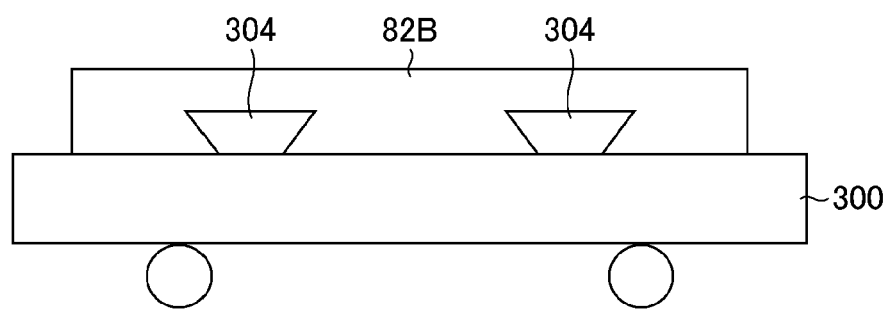
FIG. 16 is a side view in which part of rails of the dedicated trolley is enlarged.

FIG. 16 is a side view in which part of the rails 304 of the dedicated trolley 300 is enlarged. FIG. 16 omits illustration of the chamber module 200. The chamber module 200 together with the second divided rails 82B is placed on the dedicated trolley 300.

Figure 17:
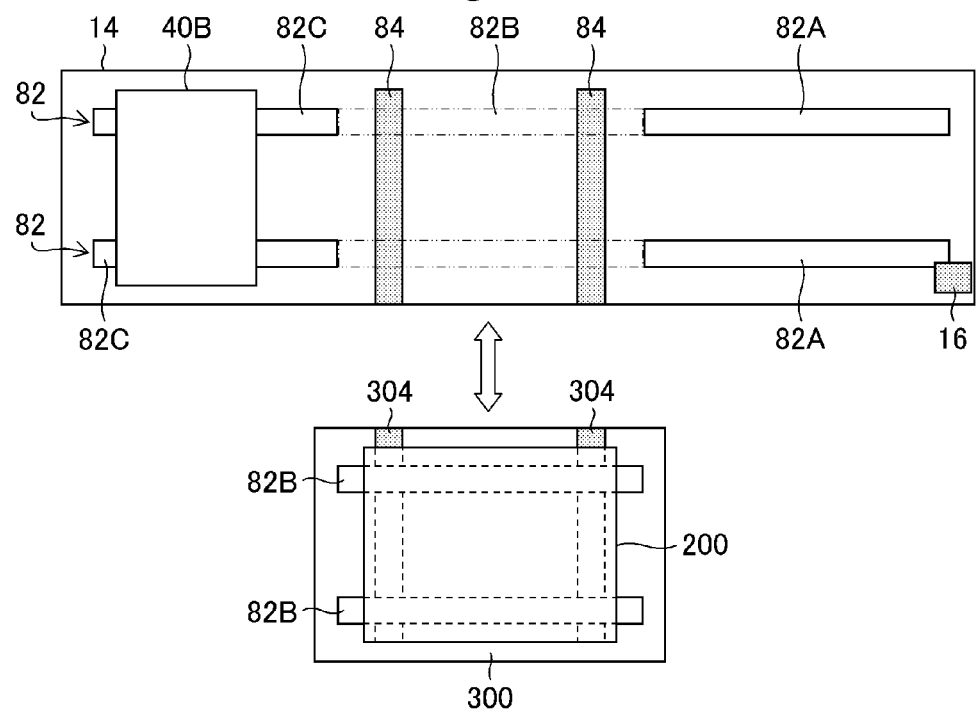
FIG. 17 is a plan view illustrating a situation in which the chamber module is moved by using the dedicated trolley.

4.2.5 Description of Situation in which Chamber Module is Moved Using Dedicated Trolley FIG. 17 is a plan view illustrating a situation in which the chamber module 200 is moved by using the dedicated trolley 300. As illustrated in FIG. 17, the chamber module 200 can be moved to a desired position by using the dedicated trolley 300. The old chamber module 200 to be replaced can be placed on the dedicated trolley 300 and moved to a position separated from the movement mechanism 14.

Then, a new chamber module 200 for replacement together with the second divided rails 82B can be placed on the dedicated trolley 300 and moved to the position of the rails 84 of the movement mechanism 14.

The new chamber module 200 after replacement is connected with the exposure apparatus 110 by a procedure opposite to that of the operation described with reference to FIGS. 9 to 17.

Figure 18:
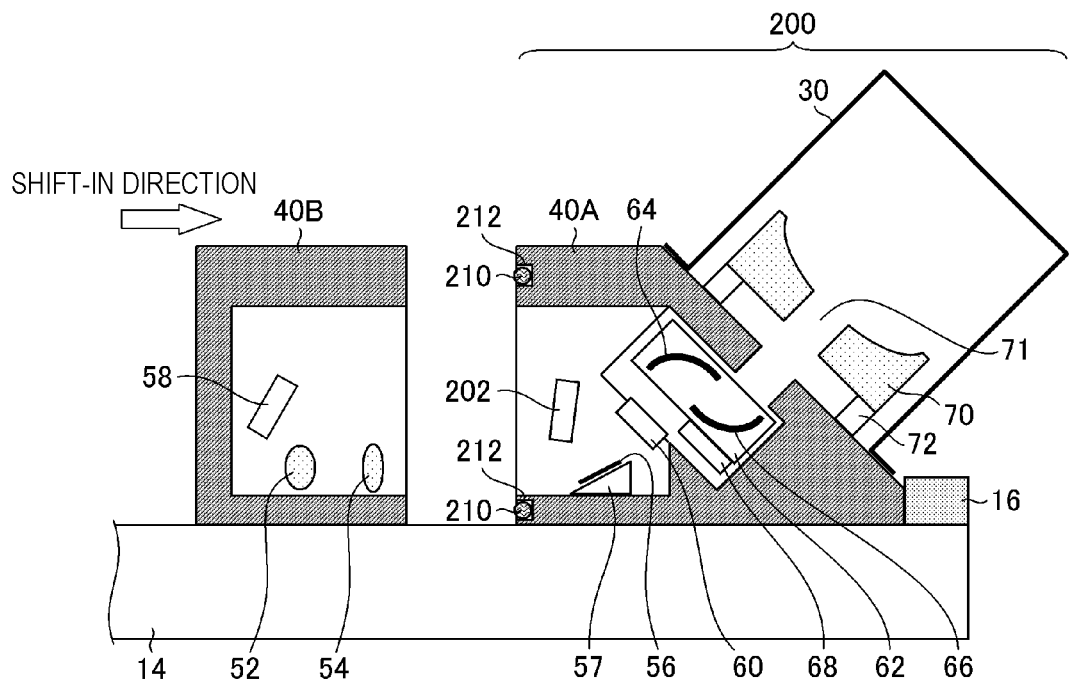
FIG. 18 is a side view illustrating an exemplary configuration 1 of a coupling part between the optical base and the chamber module.

4.3 Exemplary Configuration 1 of Coupling Part Between Optical Base and Chamber Module FIG. 18 is a side view illustrating an exemplary configuration 1 of the coupling part between the optical base 40B and the chamber module 200. When the optical base 40B and the chamber module 200 are united with each other, an O ring 210, a dovetail groove 212, and the like may be used at a coupling part between the chamber base 40A and the optical base 40B, thereby ensuring a sealing property to increase purge performance inside the optical base 40B and the chamber base 40A. Although FIG. 18 illustrates the example in which the dovetail groove 212 is provided to the chamber base 40A, the dovetail groove 212 may be provided to the optical base 40B. Contact between metal surfaces may be performed without using the O ring 210 and the like.

Figure 19:
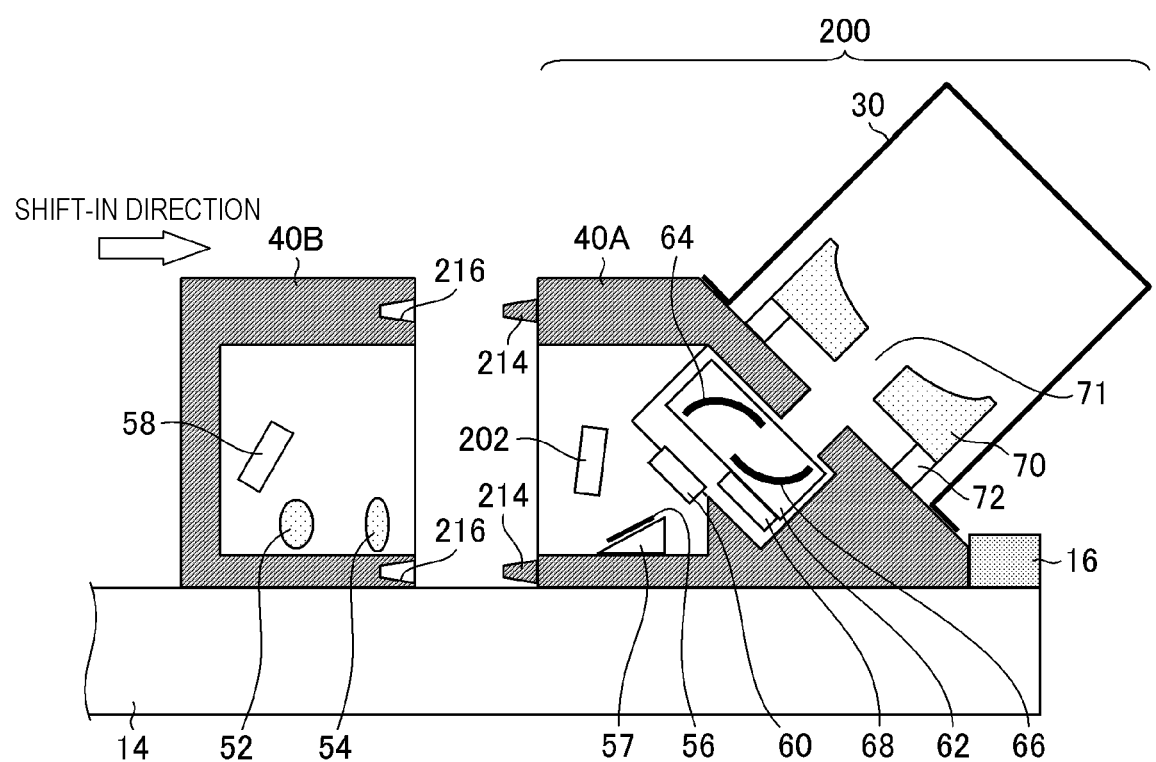
FIG. 19 is a side view illustrating an exemplary configuration 2 of the coupling part between the optical base and the chamber module.

4.4 Exemplary Configuration 2 of Coupling Part Between Optical Base and Chamber Module FIG. 19 is a side view illustrating an exemplary configuration 2 of the coupling part between the optical base 40B and the chamber module 200. To facilitate positioning, for example, a knock pin 214 or a component having a function same as the knock pin 214 may be provided to the coupling part between the optical base 40B and the chamber module 200.

The knock pin 214 may be provided on the chamber module 200 side or the optical base 40B side. FIG. 19 illustrates an example in which the knock pin 214 is provided to the chamber module 200, and a hole 216 to be engaged with the knock pin 214 is provided to the optical base 40B.

The knock pin 214 may be omitted when positioning is achieved by using only the rails 82 of the movement mechanism 14. Alternatively, the configuration of the knock pin 214 described with reference to FIG. 19 may be combined with the O ring 210 and the like described with reference to FIG. 18.

4.5 Description of Maintenance Method

The procedure of exemplary maintenance work in the EUV light generation apparatus 1 according to Embodiment 1 includes steps described below.

[Step 1] The EUV light generation apparatus 1 is separated from the exposure apparatus 110, and the optical base 40B and the chamber module 200 are shifted out separately or collectively along the rails 82 of the movement mechanism 14. The operation of step 1 is illustrated in FIGS. 9 to 14.

[Step 2] The droplet generator 32 and the droplet catcher 36 are removed from the chamber 30 of the chamber module 200 moved to the maintenance region. When the droplet generator 32 and the droplet catcher 36 are included integrally with the chamber 30 in the chamber module 200, the removal of the droplet generator 32 and the droplet catcher 36 does not need to be performed. Any drawing other than FIGS. 3 and 16 omits illustration of the droplet generator 32 and the droplet catcher 36.

[Step 3] Any sensor attached to the chamber 30, such as the droplet measurement sensor 37 is removed. When some or all of the sensors are included integrally with the chamber 30 in the chamber module 200, the removal of some or all of the sensors does not need to be performed.

[Step 4] The chamber module 200 is slid in the second direction along the rails 84 not parallel to the rails 82 of the movement mechanism 14 and is pulled out of the movement mechanism 14. The operation of step 4 is illustrated in FIGS. 13 to 15.

[Step 5] The chamber module 200 is replaced with a new chamber module 200. The operation of step 5 is illustrated in FIG. 16.

[Step 6] The new chamber module 200 after replacement is slid in the second direction along the rails 84 not parallel to the rails 82 of the movement mechanism 14 and is pressed to the position of the rails 82 of the movement mechanism 14. The operation of step 6 corresponds to, for example, change from the state illustrated in FIG. 15 to the state illustrated in FIGS. 13 and 14.

[Step 7] The sensors are attached to the new chamber module 200 after replacement. When the sensors are already attached to the new chamber module 200, various cables are connected to the sensors at step 7.

[Step 8] The sensors attached to the new chamber module 200 after replacement are adjusted. Step 8 can be omitted when the sensors attached to the new chamber module 200 are already adjusted.

[Step 9] The droplet generator 32 and the droplet catcher 36 are attached to the new chamber module 200 after replacement. Step 9 can be omitted when the droplet generator 32 and the droplet catcher 36 are already attached to the new chamber module 200.

[Step 10] The optical base 40B and the new chamber module 200 are shifted in separately or collectively. The operation of step 10 corresponds to, for example, change from the state illustrated in FIGS. 13 and 14 to the state illustrated in FIGS. 9 and 10 through the state illustrated in FIGS. 11 and 12.

[Step 11] After the optical base 40B and the chamber module 200 are united with each other, the optical axis is checked by observing an output from the light position sensor 202, and the angle of the third high reflectance mirror 56 is adjusted when needed. The check of the optical axis and the angle adjustment of the third high reflectance mirror 56 after replacement of the chamber module 200 will be described later.

4.6 Guarantee of Optical Axis

4.6.1 Configuration

The following describes a configuration for guaranteeing the optical axis through replacement of the chamber module 200 in Embodiment 1.

Figure 20:
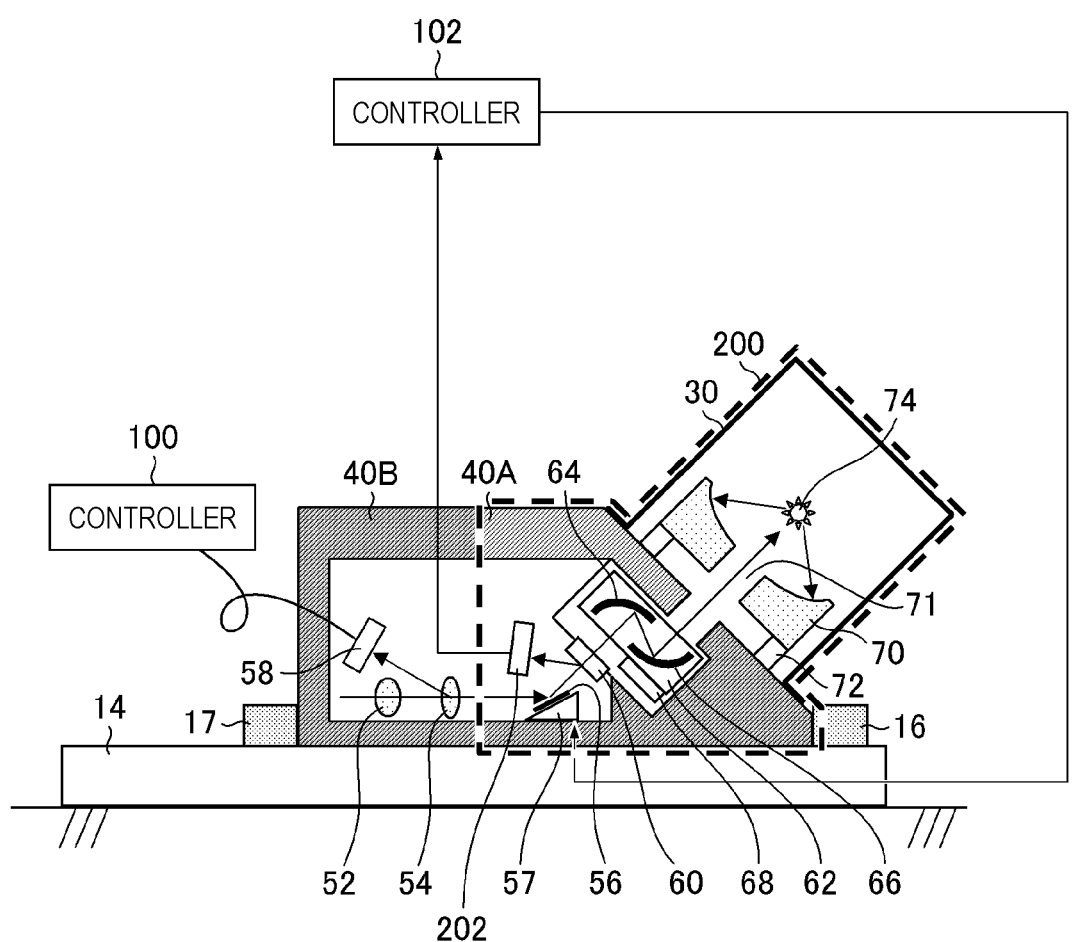
FIG. 20 is a diagram illustrating a schematic configuration of the EUV light generation apparatus at a site (field) where the EUV light generation apparatus is installed.

FIG. 20 is a diagram illustrating a schematic configuration of the EUV light generation apparatus 1 at a site (field) where the EUV light generation apparatus 1 is installed. The field is an operation site of the EUV light generation apparatus 1, such as an exposure line at a semiconductor manufacturing factory. The quality of light and the position of the optical axis to the beam splitter 54 disposed inside the optical base 40B are adjusted by the laser beam path control mechanism (not illustrated) in advance so that their values measured by the light meter 58 inside the optical base 40B are each in a predetermined allowable range. This adjustment may be performed by the controller 100. For this, the controller 100 may have a function to store the values measured by the light meter 58 and the allowable ranges.

4.6.2 Optical Axis Adjustment Process Before Chamber Module Shipment

Regarding the optical axis from the third high reflectance mirror 56 of the chamber module 200 mounted on the EUV light generation apparatus 1 after replacement to an EUV light generation target position, the optical axis in the chamber module 200 is adjusted and fixed at an own factory or the like before shipment.

Figure 21:
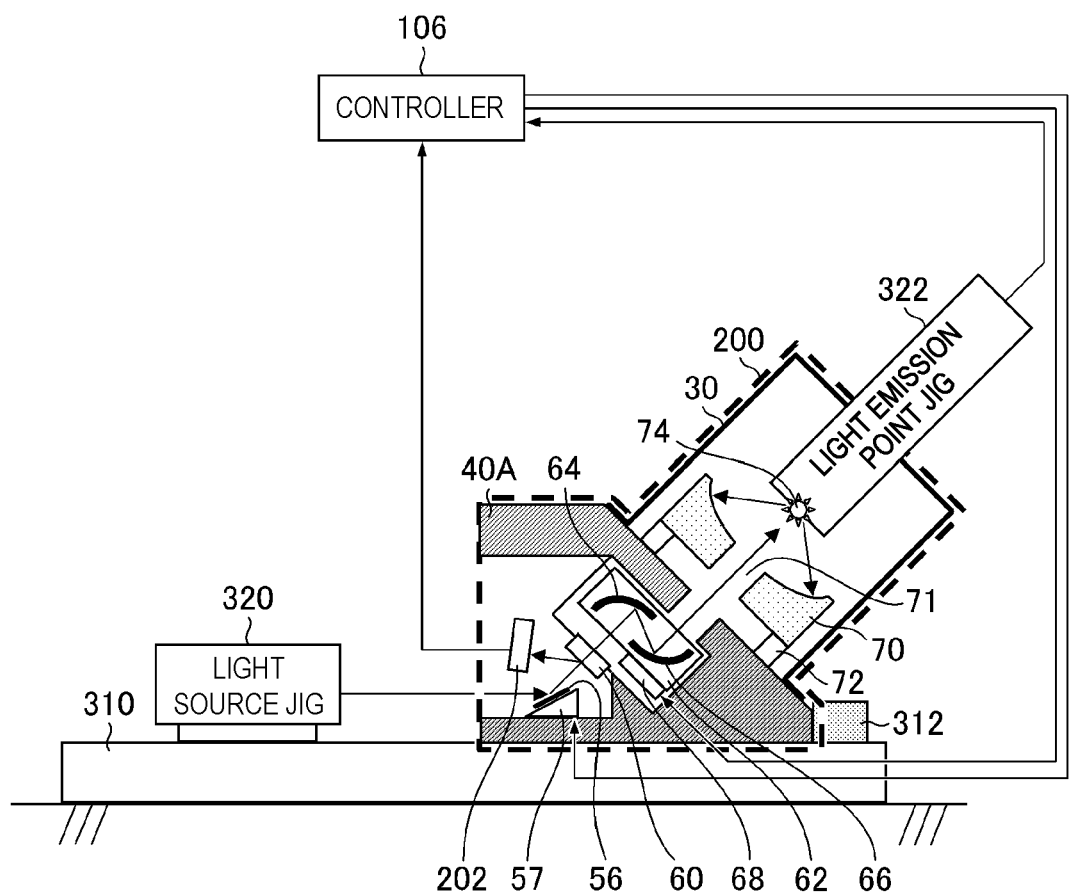
FIG. 21 is a diagram schematically illustrating a situation in which an optical axis is adjusted for a new chamber module for replacement alone.

FIG. 21 is a diagram schematically illustrating a situation in which the optical axis is adjusted for a new chamber module for replacement alone. FIG. 21 illustrates the process of optical axis adjustment performed in the own factory before chamber module shipment. The optical axis adjustment before chamber module shipment is called "module-alone adjustment" in some cases.

When the module-alone adjustment is performed, an installation jig 310, a light source jig 320, and a light emission point jig 322 are used as illustrated in FIG. 21. The installation jig 310 includes a positioning-fixation mechanism 312.

The chamber module 200 before shipment is placed on the installation jig 310 and is positioned and fixed to a specified position by the positioning-fixation mechanism 312. Optical axis adjustment using the light source jig 320 and the light emission point jig 322 is performed on the chamber module 200 being positioned on the installation jig 310.

The light source jig 320 includes, for example, a laser apparatus configured to emit a continuous-wave (CW) laser beam in a visible light wavelength band. The light source jig 320 is disposed at a predetermined position on the installation jig 310. The light source jig 320 irradiates the third high reflectance mirror 56 of the chamber module 200 being positioned on the installation jig 310 with the CW laser beam from the predetermined position at a predetermined angle. The optical axis of the laser beam emitted from the light source jig 320 is adjusted to be in a predetermined allowable range like the optical axis of a laser beam emitted from the beam splitter 54 of the optical base 40B described with reference to FIG. 20. Thus, the optical axis of the laser beam emitted from the light source jig 320 can be practically regarded to be coaxial with the optical axis of the laser beam emitted from the beam splitter 54 of the optical base 40B.

The light emission point jig 322 is disposed at the plasma point corresponding to the emission point of EUV light, and detects a laser beam transmitted through the third high reflectance mirror 56, the window 60, and the laser beam condensation optical system 62. The light emission point jig 322 is configured by, for example, a camera such as a CCD, and a monitor.

The angle of the third high reflectance mirror 56 and the position of the laser beam condensation optical system 62 are changed so that the spot of the laser beam detected by the light source jig 320 coincides with a reference target on a monitor screen of the light emission point jig 322 and the shape of the spot is adjusted to be circular.

In this manner, interindividual difference of the third high reflectance mirror 56 and the laser beam condensation optical system 62 between the chamber modules 200 can be compensated, and the profile of a $CO_2$ laser beam at the plasma point in the field can be maintained in a circular shape.

The optical axis adjustment using the light emission point jig 322 may be automatically performed by a controller 106, or may be performed by the operator remotely adjusting the angle of the third high reflectance mirror 56 and the position of the laser beam condensation optical system 62 while watching the monitor screen.

Part of reflected light of the laser beam from the light source jig 320 is detected by the light position sensor 202 while the optical axis in the chamber module 200 is adjusted as described above, and position information detected by the light position sensor 202 is stored in a memory included in the controller 106.

The controller 106 may be shipped together with the chamber module 200, but may forward the information in the memory to the controller 102 included in the EUV light generation apparatus 1 in the field. To achieve this, the controller 102 and 106 may each have a communication function and may be connected with a network (not illustrated).

The controller 102 and/or the controller 106 is an exemplary "controller configured to store information of the position detected by the light position sensor".

4.6.3 Work in Field after Chamber Module Shipment

In the field, the chamber module 200 and/or the movement mechanism 14 may include a positioning pin and an abutment jig so that the chamber module 200 is accurately mounted at the same position before and after replacement. The optical axis to the EUV light generation target position is likely to be guaranteed by mounting the optical base 40B and the new chamber module 200 after replacement at a position same as that of a chamber module before replacement.

As described above, the optical axis inside the optical base 40B is adjusted to be coaxial with the optical axis of a laser beam output from the light source jig 320 in the module-alone adjustment.

The chamber module 200 according to Embodiment 1 includes the light position sensor 202. Guide light coaxial with the optical axis of a laser beam output from the laser apparatus 20 is reflected by the window 60, and this reflected light is monitored by the light position sensor 202 to measure angle error of the chamber module 200.

The guide light monitored by the light position sensor 202 is not detected at a detection position stored in the module-alone adjustment in some cases even when the new chamber module 200 after replacement is mounted at the same position. Machine difference is generated between chamber modules due to accumulation of mechanical tolerance at component manufacturing in some cases. In such a case, the angle of the third high reflectance mirror 56 is adjusted by the actuator of the flap stage 57. When the angle of the third high reflectance mirror 56 is adjusted so that the optical axis coincides with the stored detection position of the light position sensor 202, the optical axis extends to the EUV light generation target position as a result.

The controller 102 monitors the optical axis of a laser beam based on a detection signal from the light position sensor 202. In addition, the controller 102 stores, in a memory, the detection position of the optical axis adjusted in the process of optical axis adjustment before chamber module shipment, the detection position being obtained by the light position sensor 202. Furthermore, the controller 102 adjusts the mirror angle so that the optical axis coincides with the stored detection position of the light position sensor 202.

4.7 Effect

According to Embodiment 1, the chamber module 200 is replaceable from the optical base 40B, and the chamber module 200 can be collectively replaced with a new chamber module, which leads to significant reduction of a down time due to maintenance work. For example, a total work time of 27.5 hours described with reference to Table 1 can be significantly reduced to one hour approximately according to Embodiment 1. When the configuration of Embodiment 1 is employed, a time taken for maintenance work is expected to one hour approximately at shortest, which indicates significant reduction with the down time difference of "−26.5 h" as compared to the example described with reference to Table 1.

5. Embodiment 2

5.1 Configuration

Figure 22:
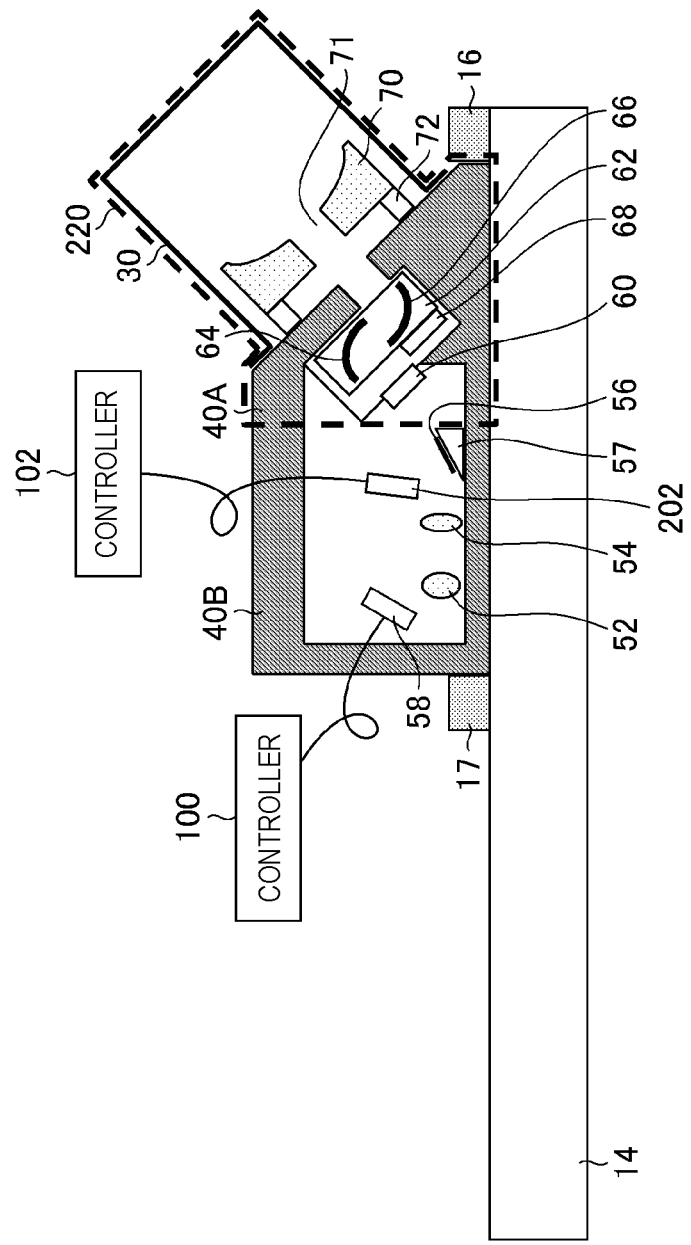
FIG. 22 is a side view schematically illustrating the configuration of an EUV light generation apparatus 1 according to Embodiment 2, and partially includes a cross-sectional view.

FIG. 22 is a diagram illustrating the configuration of the EUV light generation apparatus 1 according to Embodiment 2. Any difference from Embodiment 1 will be described below. FIG. 22 omits illustration of the rails 82 that are same as those in Embodiment 1 described with reference to FIG. 10.

In the EUV light generation apparatus 1 according to Embodiment 2 illustrated in FIG. 22, a part surrounded by a dashed line in FIG. 22 is integrated as a chamber module 220. In the chamber module 220 illustrated in FIG. 22, the chamber 30, the EUV light condenser mirror 70, the laser beam condensation optical system 62, the condensation optical system stage 68, and the window 60 form a module fixed to the chamber base 40A.

In the EUV light generation apparatus 1 according to Embodiment 2, the third high reflectance mirror 56, the flap stage 57, and the light position sensor 202 are fixed to the optical base 40B. The configuration of the chamber module 220 illustrated in FIG. 22 may be employed in place of the chamber module 200 according to Embodiment 1.

The configuration of Embodiment 2 may be employed when the reproducibility of the installation position of the chamber module 200 on the movement mechanism 14 is so high that adjustment of the angle of the third high reflectance mirror 56 after chamber module replacement is unnecessary.

Similarly to Embodiment 1, the configurations of the O ring 210 described with reference to FIG. 18 and the knock pin 214 or the like described with reference to FIG. 19 may be employed in the configuration of Embodiment 2.

5.2 Operation

Operation performed with the configuration of Embodiment 2 is same as that in Embodiment 1. However, the work at step 11 after the optical base 40B and the chamber module 220 are united with each other may be omitted. For reference, FIGS. 23 and 24 are presented.

Figure 23:
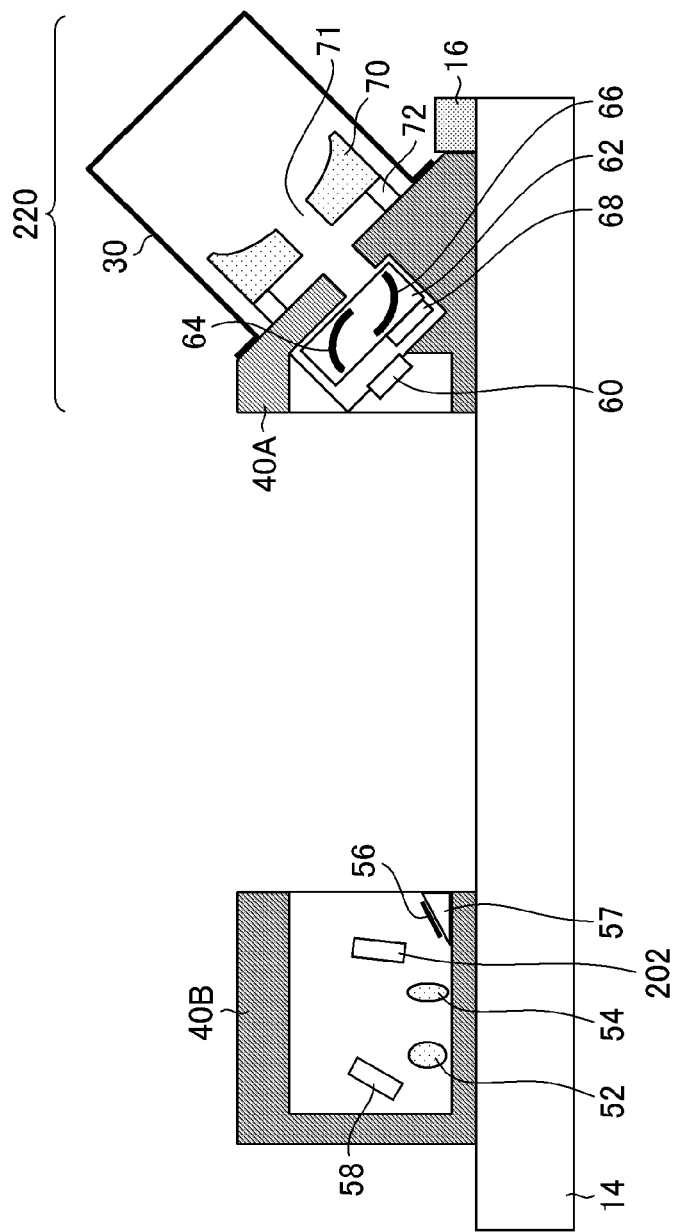
FIG. 23 is a side view illustrating a state in which the optical base is positioned in the maintenance region and the chamber module is disposed at the predetermined position to which positioning is performed, and partially includes a cross-sectional view.

FIG. 23 is a diagram illustrating a state in which the optical base 40B is positioned in the maintenance region and only the chamber module 220 is disposed at the predetermined position to which positioning is performed by the positioning-fixation mechanism 16. FIG. 23 is a side view in place of FIG. 12. FIG. 23 omits illustration of the rails 82 that are same as those in Embodiment 1.

FIG. 24 is a diagram illustrating a state in which the chamber module 220 is disposed at the module pull-out position in the maintenance region. FIG. 24 is a side view in place of FIG. 14. FIG. 24 omits illustration of the rails 82 and a dedicated trolley that are same as those in Embodiment 1.

5.3 Effect

Embodiment 2 achieves an effect same as that of Embodiment 1 and can significantly reduce the down time as compared to the example described with reference to Table 1.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more."

What is claimed is:

1. An extreme ultraviolet light generation apparatus comprising:
   an optical base;
   a chamber module replaceable from the optical base; and
   a movement mechanism configured to move the optical base and the chamber module,
   the movement mechanism including
      a first mechanism configured to move the optical base and the chamber module in a first direction;
      a second mechanism configured to move the chamber module in a second direction not parallel to the first direction;
      a first rail as the first mechanism; and
      a second rail as the second mechanism,
   wherein
      the first rail is divided in the first direction, and
      a divided rail as part of the divided first rail is movable along the second rail together with the chamber module.

2. The extreme ultraviolet light generation apparatus according to claim 1, wherein, when the chamber module is to be replaced,
   a trolley provided with a third rail connectable with the second rail is used, and
   the chamber module together with the divided rail is placed on the trolley and moved.

3. A maintenance method for an extreme ultraviolet light generation apparatus connected with an exposure apparatus, the maintenance method comprising:
   separating, from the exposure apparatus, an optical base of the extreme ultraviolet light generation apparatus and a chamber module replaceable from the optical base, and moving the optical base and the chamber module in a first direction;
   moving, in a second direction not parallel to the first direction, the chamber module moved in the first direction; and
   replacing the chamber module moved in the second direction with a new chamber module.

4. The maintenance method according to claim 3, wherein the chamber module includes
   a chamber in which extreme ultraviolet light is generated,
   a condenser mirror disposed inside the chamber and configured to condense the extreme ultraviolet light generated inside the chamber,
   a window configured to transmit, into the chamber, a laser beam introduced into the optical base, and having a function to seal up the chamber, and
   a laser beam condensation optical system configured to condense the laser beam having transmitted through the window.

5. The maintenance method according to claim 4, wherein the chamber module includes
   a mirror configured to reflect a laser beam introduced from outside of the optical base so that the laser beam is incident on the window, and
   a light position sensor configured to detect a position of reflected light of the laser beam incident on the window from the window.

6. The maintenance method according to claim 5, further comprising:
   uniting the new chamber module after replacement and the optical base with each other; and
   adjusting the angle of the mirror while obtaining position information from the light position sensor.

7. The maintenance method according to claim 6, further comprising:
   adjusting an optical axis in the new chamber module in advance before the replacement and storing the position information obtained from the light position sensor; and
   adjusting the angle of the mirror by using the stored position information.

* * * * *